United States Patent
Otaka et al.

(10) Patent No.: US 8,451,942 B2
(45) Date of Patent: *May 28, 2013

(54) WIRELESS TRANSMISSION APPARATUS USING CARTESIAN LOOP

(75) Inventors: Shoji Otaka, Yokohama (JP); Hiroaki Ishihara, Fuchu (JP); Masahiro Hosoya, Kawasaki (JP); Osamu Watanabe, Chigasaki (JP); Kohei Onizuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 193 days.

This patent is subject to a terminal disclaimer.

(21) Appl. No.: 12/957,856

(22) Filed: Dec. 1, 2010

(65) Prior Publication Data

US 2011/0116558 A1  May 19, 2011

Related U.S. Application Data

(63) Continuation of application No. PCT/JP2009/056009, filed on Mar. 25, 2009.

(30) Foreign Application Priority Data

Jun. 2, 2008 (JP) ............................... 2008-145180
Feb. 19, 2009 (JP) ............................... 2009-036702

(51) Int. Cl.
*H04K 1/02* (2006.01)

(52) U.S. Cl.
USPC ........................... 375/296; 375/219; 455/126

(58) Field of Classification Search
USPC ................ 375/219–222, 296, 358; 455/91, 455/126, 127.1
See application file for complete search history.

(56) References Cited

U.S. PATENT DOCUMENTS 5,134,718 A * 7/1992 Gailus ........................... 455/102
6,606,483 B1 * 8/2003 Baker et al. .................... 455/126

(Continued)

FOREIGN PATENT DOCUMENTS

| JP | 10-136048 | 5/1998 |
| JP | 2001-57522 | 2/2001 |

(Continued)

OTHER PUBLICATIONS

Dogan, et al., "*A DC-10GHZ Linear-in-dB Attenuator in 0.13 μm CMOS Technology*", IEEE 2004 Custom Integrated Circuits Coference, pp. 609-612.

(Continued)

*Primary Examiner* — Emmanuel Bayard
(74) *Attorney, Agent, or Firm* — Ohlandt, Greeley, Ruggerio and Perle, L.L.P.

(57) ABSTRACT

In one embodiment, a wireless transmission apparatus is disclosed. The apparatus includes a generator unit, an amplitude adjuster unit, a phase adjuster unit, and a setting unit. The generator unit generates an amplitude control signal that minimizes an amplitude difference and a phase control signal that minimizes a phase difference in a state in which a power is set during an OFF period of a switch. The amplitude adjuster unit adjusts an amplitude of a feedback RF signal according to the amplitude control signal during an ON period of the switch. The phase adjuster unit adjusts a phase of a local signal according to the phase control signal during the ON period. The setting unit sets, for a Cartesian loop, a first loop gain when the switch is OFF, and a second loop gain higher than the first loop gain when the switch is turned from OFF to ON.

16 Claims, 21 Drawing Sheets

U.S. PATENT DOCUMENTS

| | | | |
|---|---|---|---|
| 8,060,038 B2 * | 11/2011 | Otaka et al. | 455/126 |
| 2002/0097811 A1 * | 7/2002 | Kubo et al. | 375/296 |
| 2004/0166813 A1 * | 8/2004 | Mann et al. | 455/69 |
| 2009/0042521 A1 | 2/2009 | Otaka et al. | 455/126 |

FOREIGN PATENT DOCUMENTS

| | | |
|---|---|---|
| JP | 2001-057522 | 2/2001 |
| JP | 2003-168931 | 6/2003 |
| JP | 2004-222259 | 8/2004 |
| JP | 2006-086928 | 3/2006 |

OTHER PUBLICATIONS

International Preliminary Report on Patentability dated Jan. 20, 2011 from corresponding International Patent Application No. PCT/JP2009/056009.

* cited by examiner

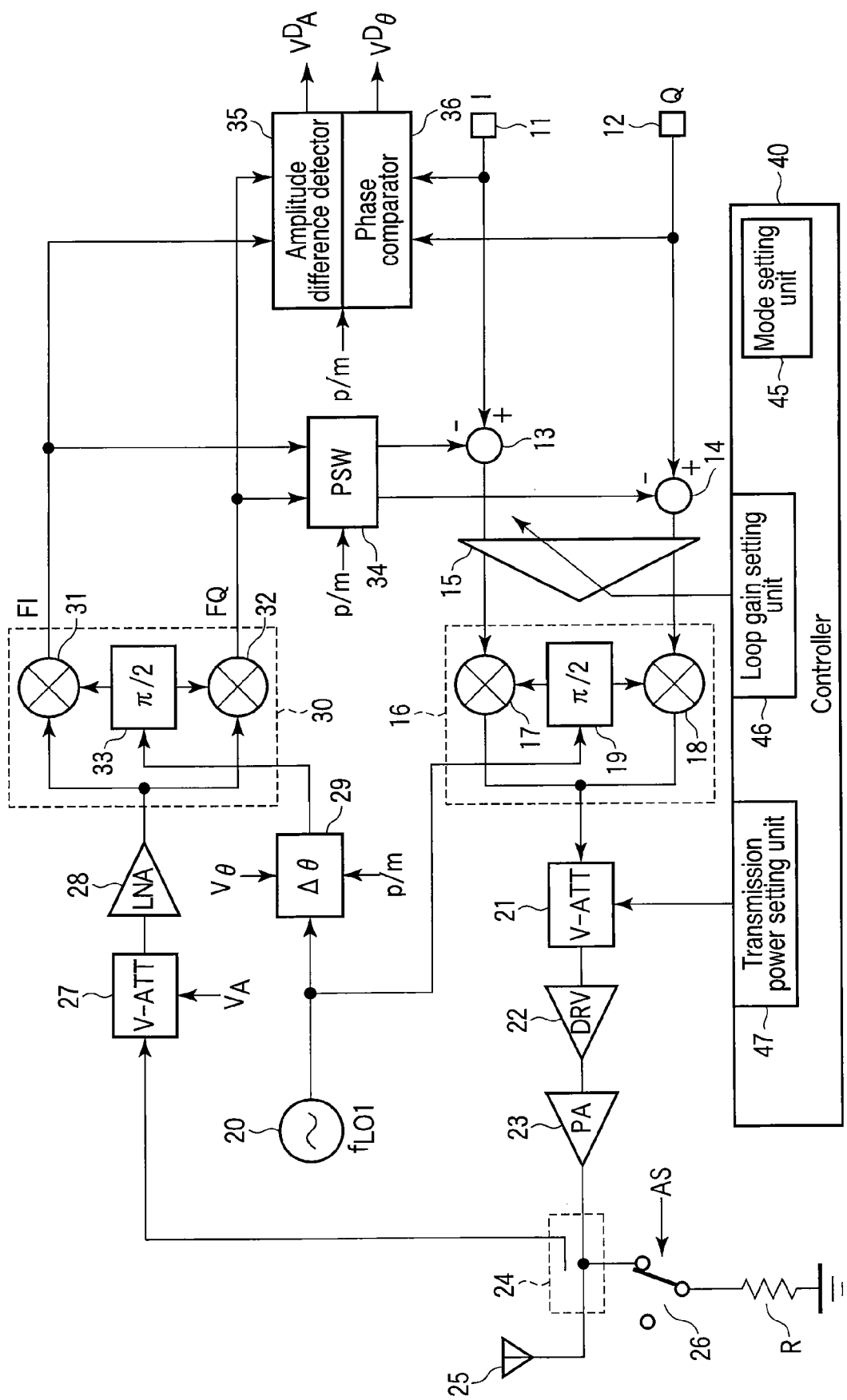
F I G. 1

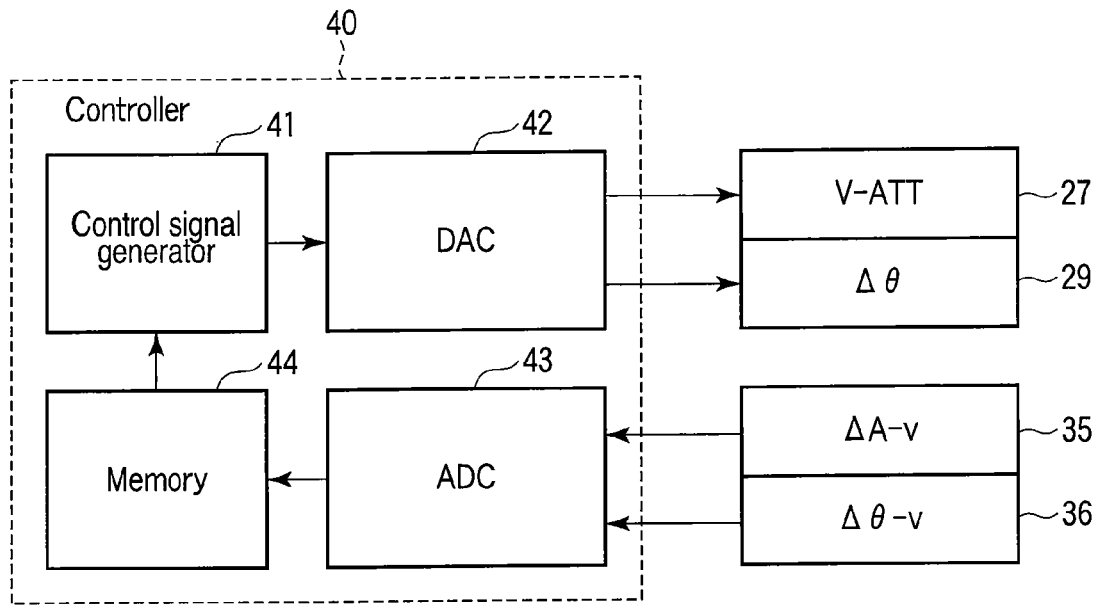
F I G. 4
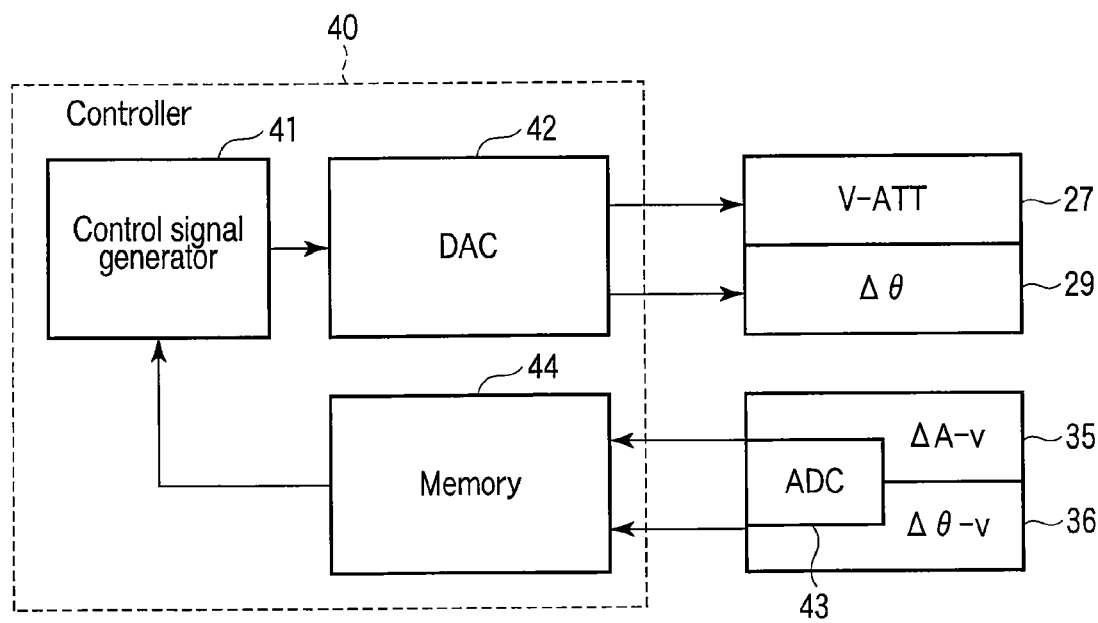
F I G. 5

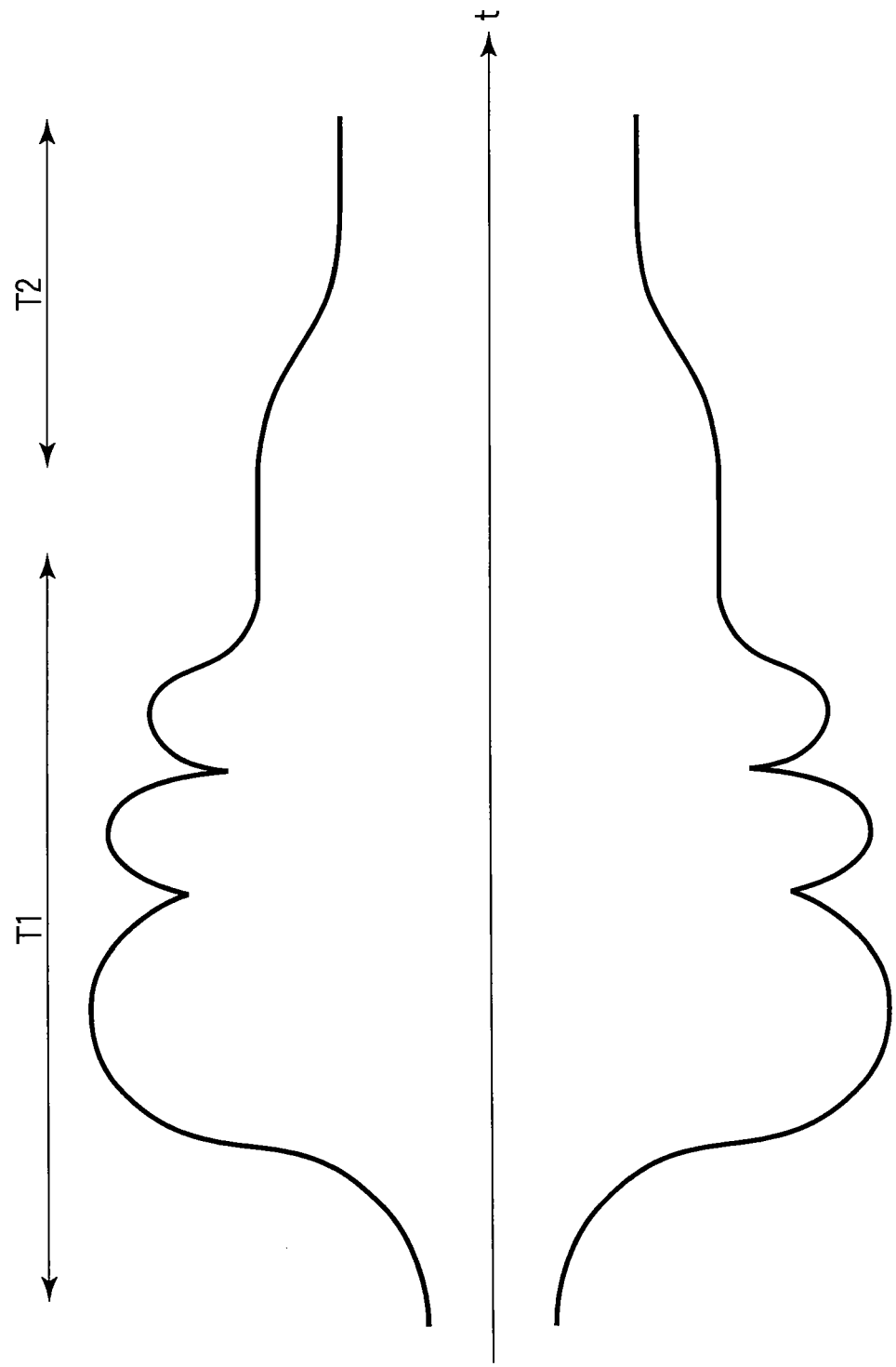
F I G. 10

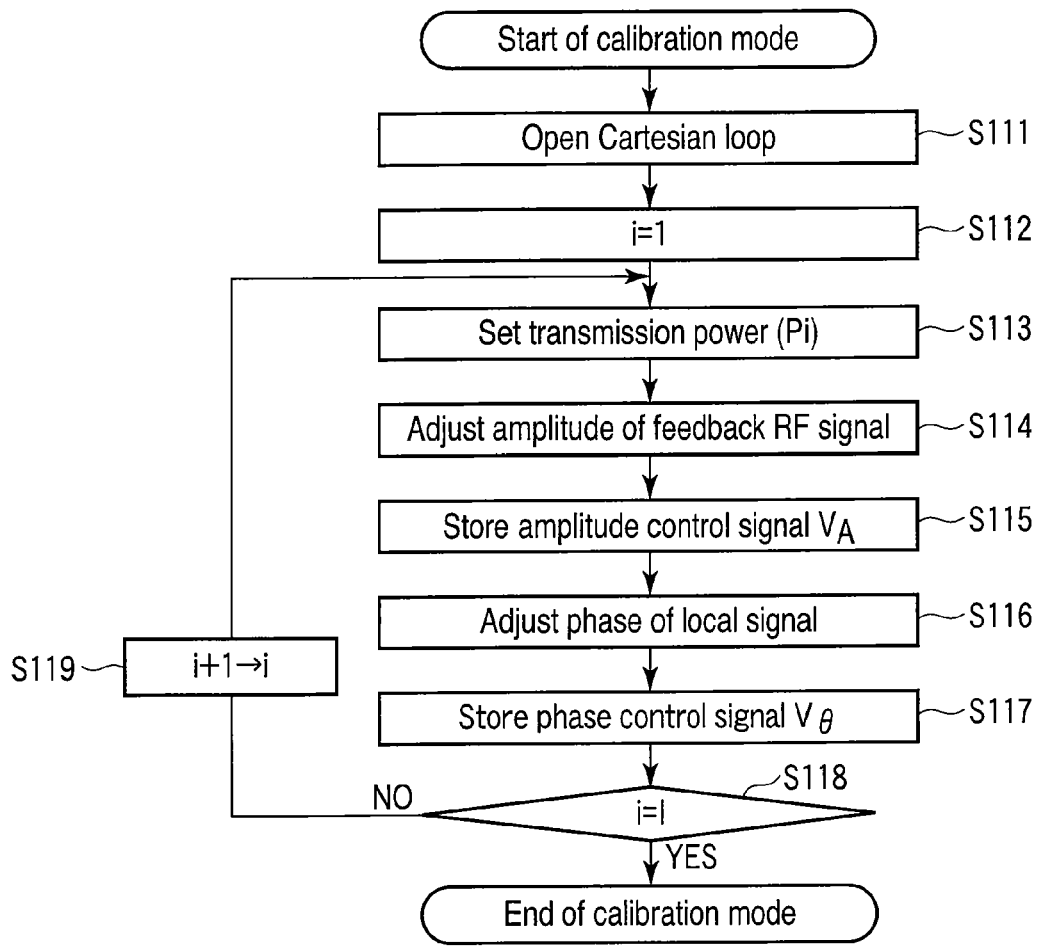
F I G. 11
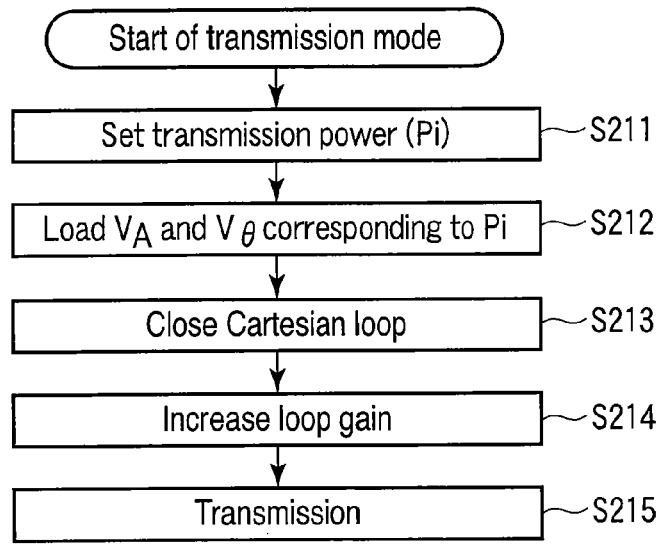
F I G. 12

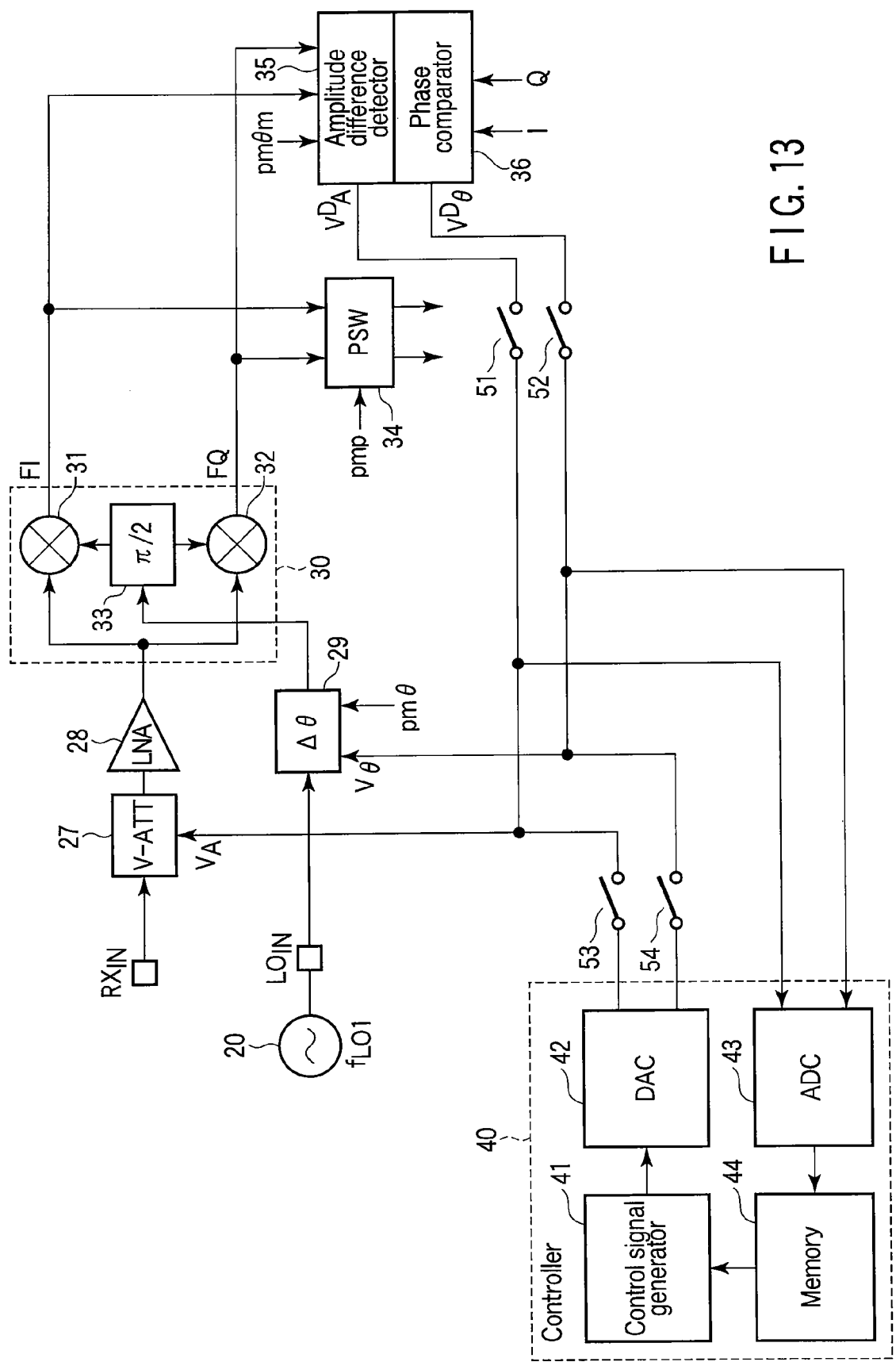
F I G. 13

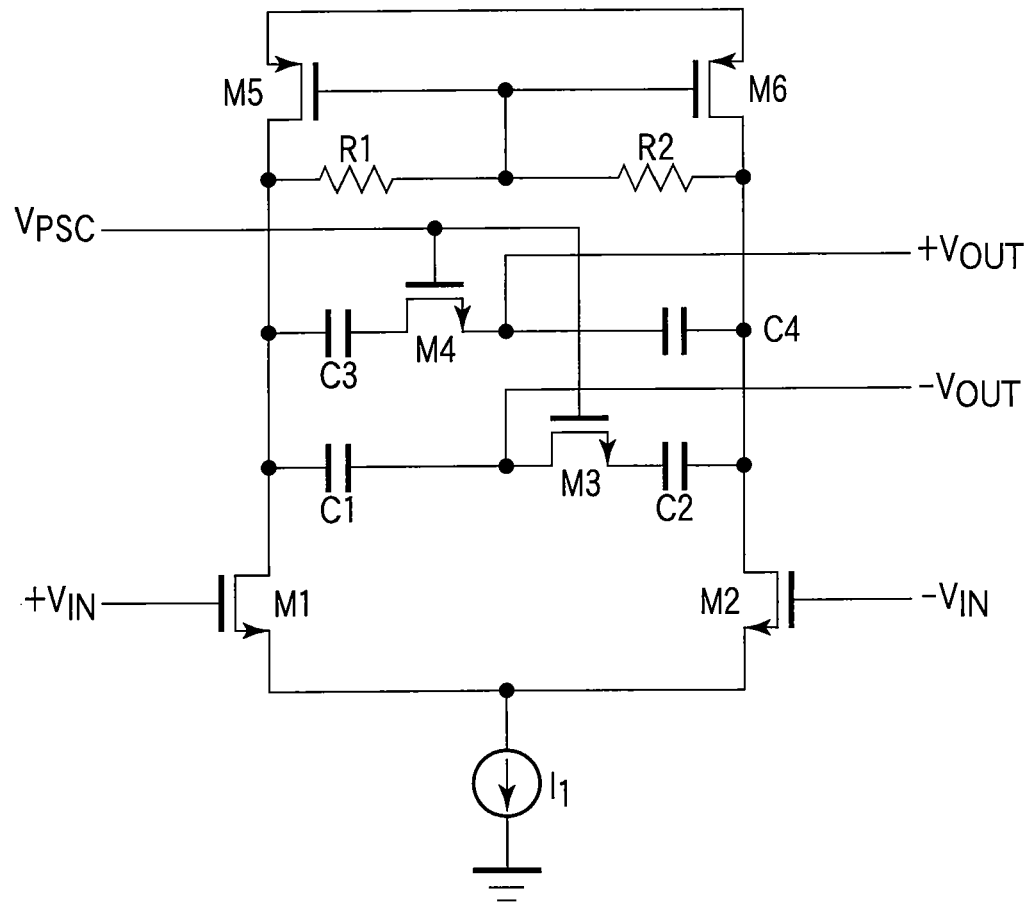
F I G. 17

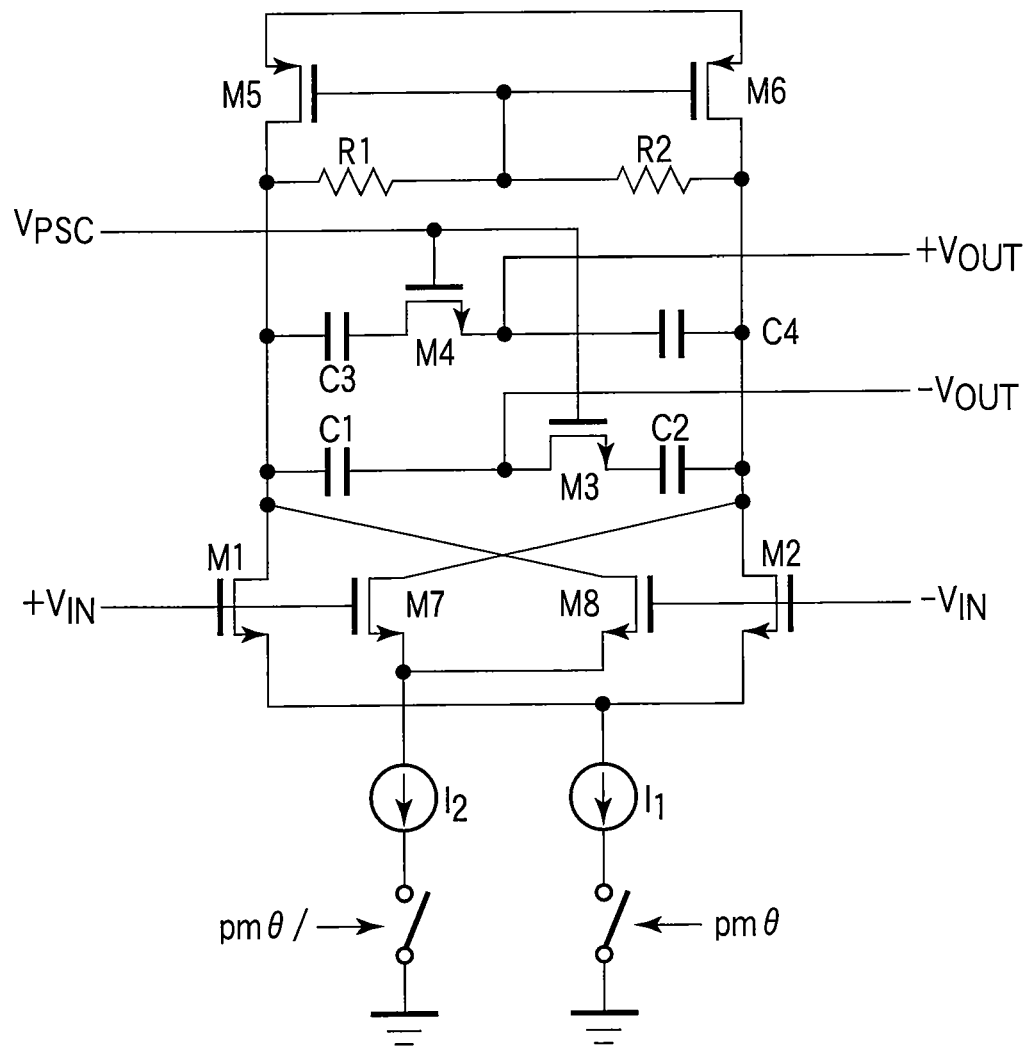
F I G. 18

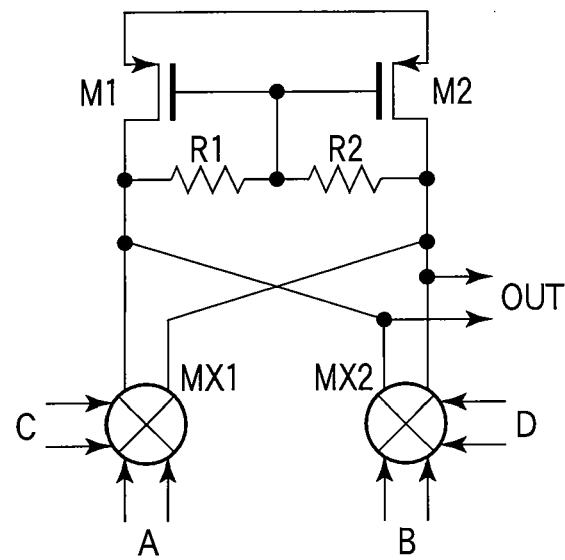
F I G. 19
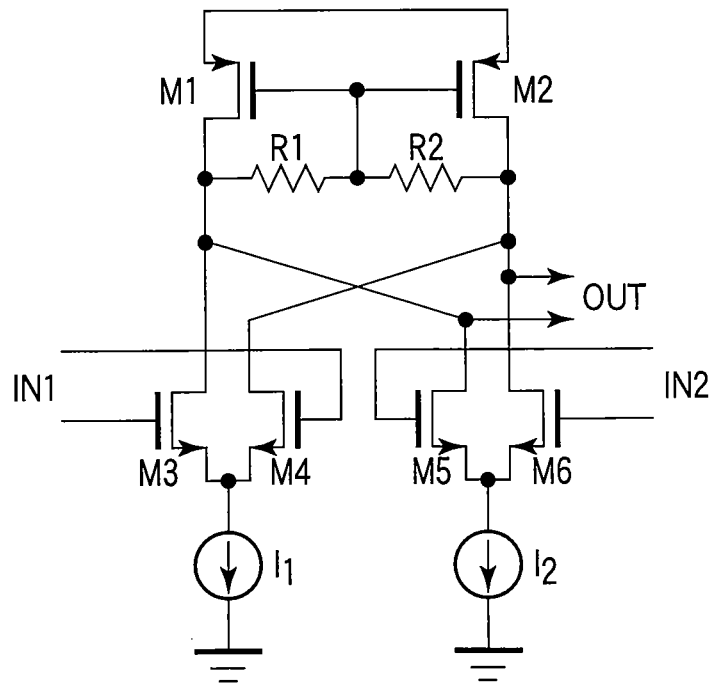
F I G. 20

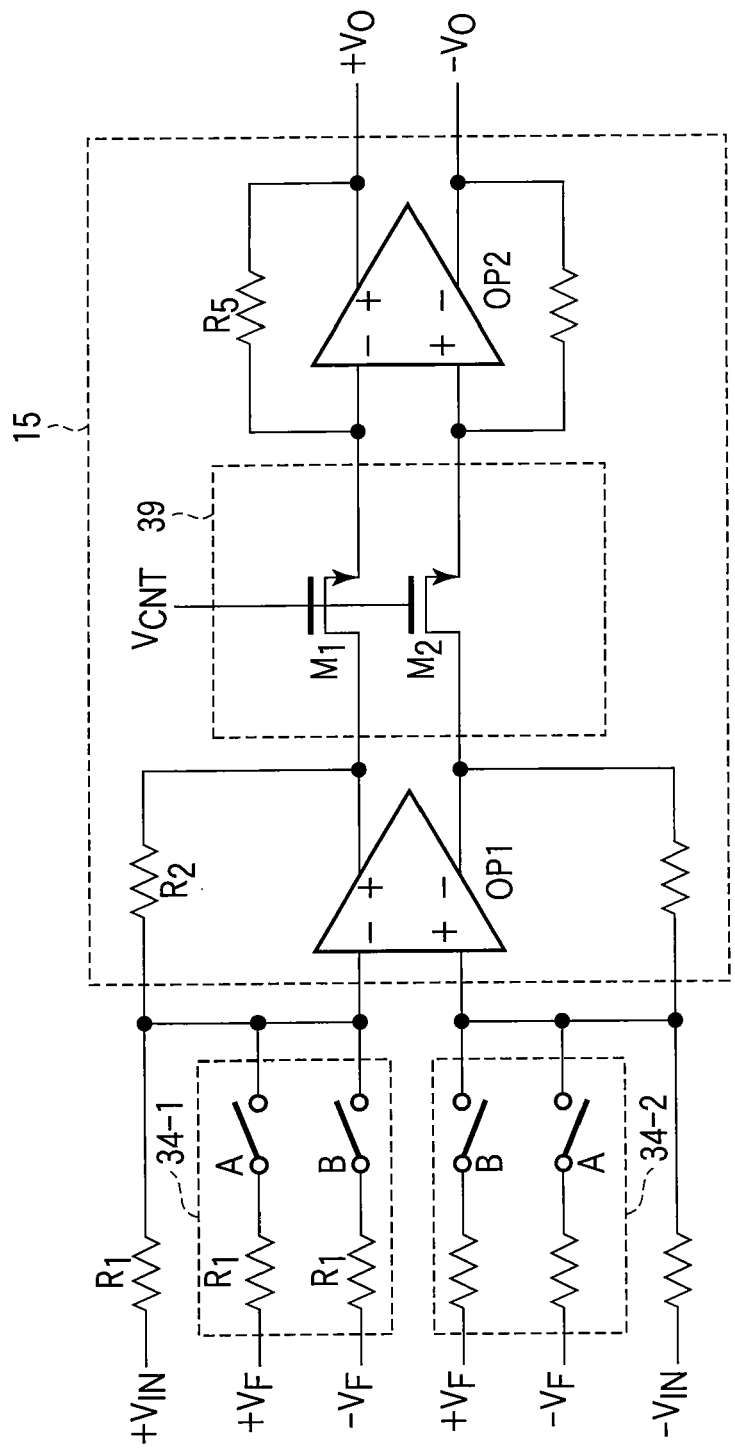
F I G. 22

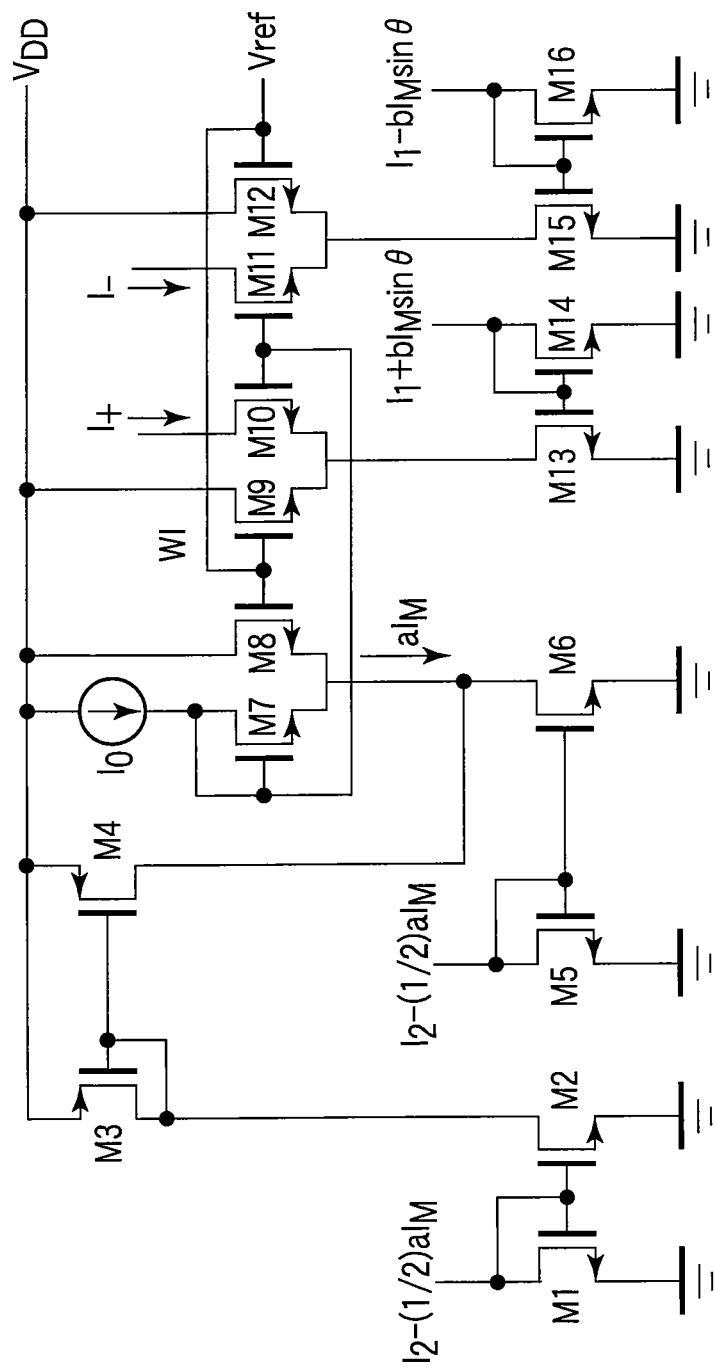
F I G. 25

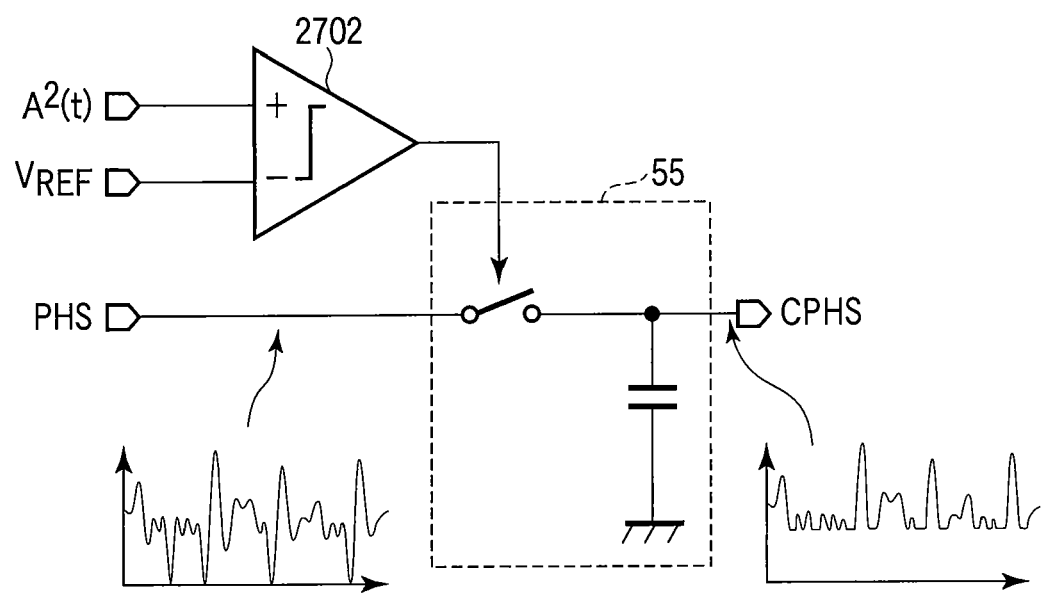
F I G. 28

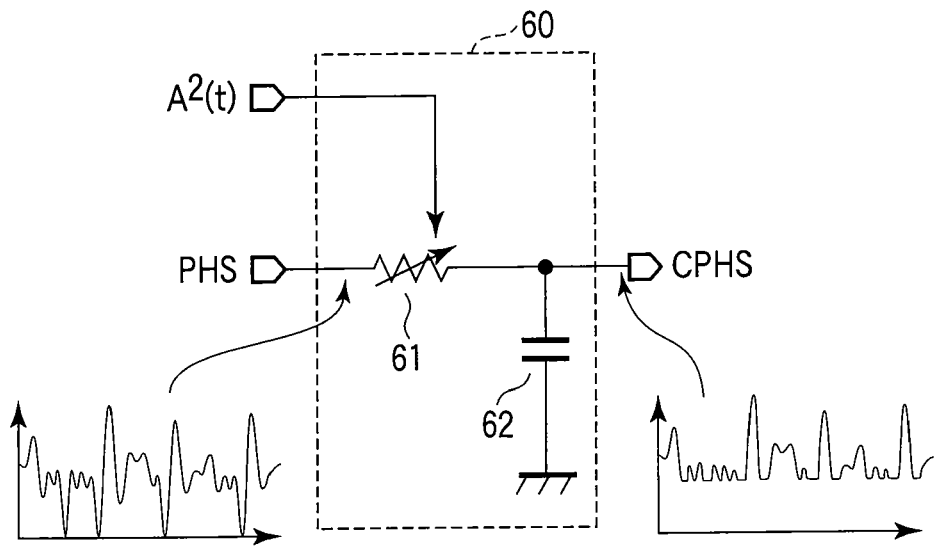
F I G. 30
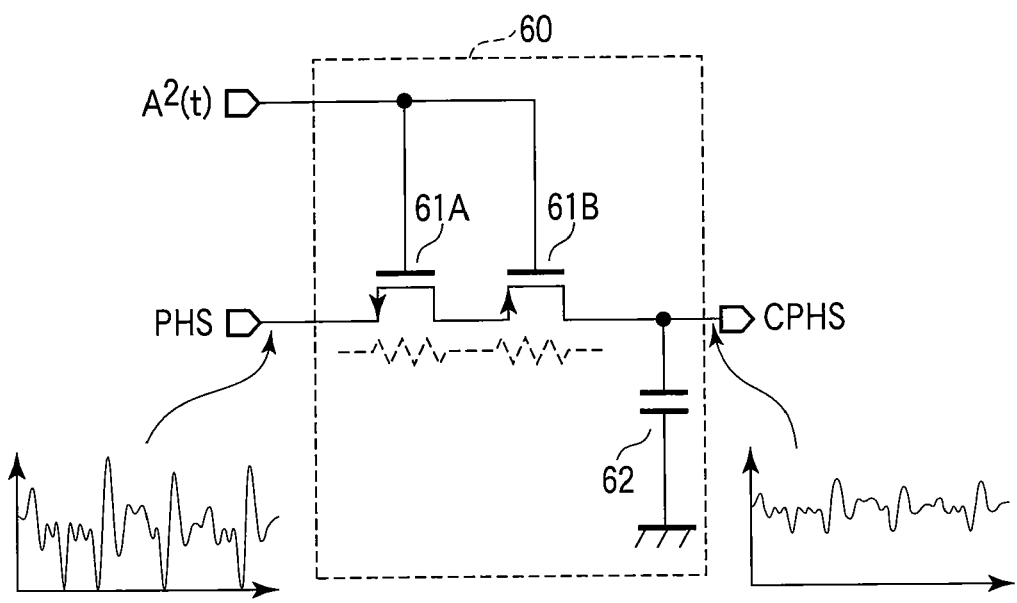
F I G. 31

WIRELESS TRANSMISSION APPARATUS USING CARTESIAN LOOP

CROSS REFERENCE TO RELATED APPLICATIONS

This is a Continuation Application of PCT Application No. PCT/JP2009/056009, filed Mar. 25, 2009, which was published under PCT Article 21(2) in Japanese.

This application is based upon and claims the benefit of priority from Japanese Patent Applications No. 2008-145180, filed Jun. 2, 2008; and No. 2009-036702, filed Feb. 19, 2009; the entire contents of both of which are incorporated herein by reference.

FIELD

Embodiments described herein relate generally to a wireless transmission apparatus using a Cartesian loop.

BACKGROUND

In a wireless communication apparatus such as a transceiver, a power amplifier amplifies a transmission RF (radio frequency) signal so as to radiate the transmission RF signal from an antenna on the transmitting side. The power amplifier is required to maintain linearity so that the transmission RF signal falls within a spectrum mask specified by the wireless system standard. Also, the power amplifier is also demanded to reduce an odd distortion since, for example, an adjacent channel leakage power as one of the parameters specified by the wireless system standard mainly occurs due to the odd distortion of the power amplifier.

In order to improve the linearity of the power amplifier by reducing the odd distortion, for example, the Cartesian loop is used. The Cartesian loop is a feedback loop including a feedback path in which part of the power of a transmission RF signal is demodulated by a quadrature demodulator to baseband I/Q signals, and the baseband I/Q signals are fed back to inputs of a quadrature modulator of a transmitting unit.

More specifically, part of the power of a transmission RF signal output from the power amplifier is guided to the feedback path of the Cartesian loop, and is input to the quadrature demodulator via a variable attenuator and low-noise amplifier. Feedback I/Q signals obtained by the quadrature demodulator are synthesized with (added to or subtracted from) input I/Q signals. The synthesized I/Q signals are input to the quadrature modulator via a baseband amplifier. If a gain from the quadrature modulator to the quadrature demodulator is sufficiently larger than 1, a gain from the input terminal of the quadrature modulator to the output terminal of the power amplifier is decided by an attenuation amount of the feedback path of the Cartesian loop, and the linearity of the transmission RF signal depends on that of the feedback path. Therefore, high linearity of the feedback path is required.

On the other hand, since a transceiver operates using an internal battery as a power source, an IC power consumption reduction technique is indispensable so as to assure a long communication time by reducing the battery consumption. In the transceiver, the power amplifier of the transmitting unit accounts for the largest consumption power. A wireless unit used in the transceiver is highly integrated, and low- to high-frequency units can recently be manufactured by a CMOS (complementary metal-oxide semiconductor) technology suitable for cost reduction. In general, a cost reduction of the power amplifier can be attained if the CMOS structure is adopted; however, this deteriorates efficiency. The Cartesian loop is a high linearization technique for the wireless unit, as described above, and it can also be considered as a technique for achieving a highly efficient power amplifier, from another point of view. Therefore, by applying the Cartesian loop to the wireless unit of the CMOS structure, the efficiency of the power amplifier or wireless unit can be improved.

Since the Cartesian loop has a feedback circuit, how to assure operation stability is important. In order to assure the stability of the Cartesian loop, JP-A 10-136048 (KOKAI) has proposed a method of detecting the phase of feedback I/Q signals in an open state of the Cartesian loop, and controlling the phase of a local signal supplied to the quadrature demodulator in the feedback path in accordance with the phase difference between the feedback I/Q signals and input I/Q signals. However, JP-A 10-136048 (KOKAI) does not consider the variable power (transmission power) of the transmission RF signal.

When the Cartesian loop is used, it is possible to reduce the consumption power of the entire transmission apparatus even in consideration of the consumption power of the feedback circuit at the time of a high power output of the transmission RF signal. On the other hand, at the time of a low power output of the transmission RF signal, since the linearity of the power amplifier and a driver amplifier which drives the power amplifier is high, high linearization using the Cartesian loop is not required. If the Cartesian loop is active even at the time of a low power output, the efficiency drops due to the consumption power of the feedback circuit. Therefore, in order to efficiently execute transmission power control as used in a recent wireless system, it is desirable to open/close the Cartesian loop according to the transmission power in terms of a consumption power reduction.

BRIEF DESCRIPTION OF THE DRAWINGS

FIG. 1 is a block diagram showing a wireless transmission apparatus according to an embodiment;

FIG. 4 is a block diagram showing a practical example of the controller;

FIG. 5 is a block diagram showing another practical example of the controller;

FIG. 10 is a chart showing a transient response when the Cartesian loop is closed, and that when a transmission power is changed while the Cartesian loop is kept closed;

FIG. 11 is a flowchart showing the processing sequence of a startup calibration mode;

FIG. 12 is a flowchart showing the processing sequence of a transmission mode after the startup calibration mode;

FIG. 13 is a block diagram showing some components of a radio transmission apparatus using analog feedback control according to another embodiment;

FIG. 17 is a circuit diagram showing a practical example of a phase shifter;

FIG. 18 is a circuit diagram showing another practical example of the phase shifter;

FIG. 19 is a circuit diagram showing an amplitude/phase detection circuit;

FIG. 20 is a circuit diagram of a difference detection circuit;

FIG. 22 is a circuit diagram showing another practical example of the polarity inversion switch and baseband amplifier;

FIG. 25 is a circuit diagram showing a practical example of an amplitude normalizer in FIG. 23;

FIG. 28 is a block diagram showing the second example of the amplitude normalizer in FIG. 26;

FIG. 30 is a block diagram showing the fourth example of the amplitude normalizer in FIG. 26; and FIG. 31 is a block diagram showing the fifth example of the amplitude normalizer in FIG. 26.

DETAILED DESCRIPTION

Figure 2:
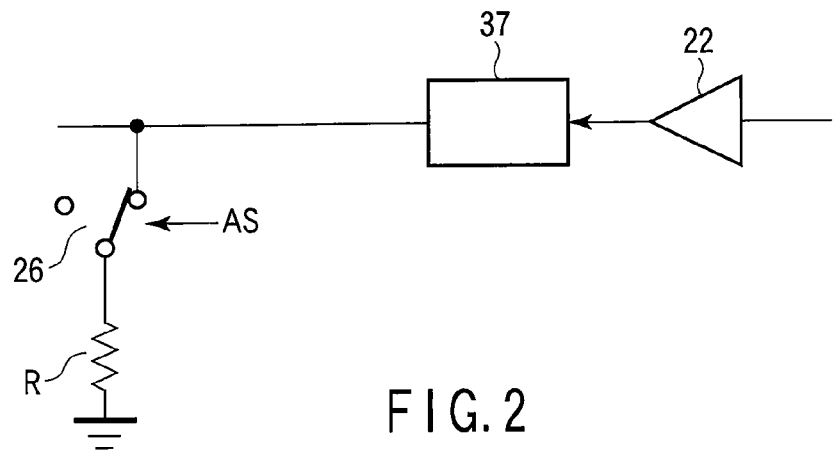
FIG. 2 is a circuit diagram showing another example of a termination method of an output of a power amplifier.

In general, according to one embodiment, a wireless transmission apparatus is disclosed. The apparatus includes adder units, a quadrature modulator unit, a power amplifier unit, a quadrature demodulator unit, a switch unit, an amplitude difference detector unit, a phase difference detector unit, a normalizer unit, a power setting unit, a control signal generator unit, a memory unit, an amplitude adjuster unit, a phase adjuster unit, and a gain setting unit. Adder units generate synthesized I/Q signals by synthesizing input I/Q signals to be transmitted, and feedback I/Q signals. A quadrature modulator unit generates a quadrature modulated signal. A power amplifier unit amplifies the quadrature modulated signal and outputs a transmission RF signal. A quadrature demodulator unit generates the feedback I/Q signals by applying quadrature demodulation using a local signal to a feedback RF signal branched from the transmission RF signal. A switch unit is used to set ON/OFF of an input of the feedback I/Q signals to the adder units. An amplitude difference detector unit generates an amplitude difference detection signal by detecting an amplitude difference between the input I/Q signals and the feedback I/Q signals during an OFF period of the switch unit. A phase difference detector unit generates a phase difference detection signal by detecting a phase difference between the input I/Q signals and the feedback I/Q signals during the OFF period of the switch unit. A normalizer unit generates a normalized phase difference signal by normalizing the phase difference detection signal by a signal amplitude of one of the input I/Q signals and the feedback I/Q signals. A power setting unit sets a power of the transmission RF signal. A control signal generator unit receives the amplitude difference detection signal and the normalized phase difference signal, and generates an amplitude control signal that minimizes the amplitude difference and a phase control signal that minimizes the phase difference in a state in which the power is set during the OFF period of the switch unit. A memory unit stores the amplitude control signal and the phase control signal. An amplitude adjuster unit adjusts an amplitude of the feedback RF signal according to the amplitude control signal stored in the memory unit during an ON period of the switch unit. A phase adjuster unit adjusts a phase of the local signal according to the phase control signal stored in the memory unit during the ON period of the switch unit. A gain setting unit sets, for the Cartesian loop, a first loop gain when the switch is OFF, and a second loop gain higher than the first loop gain when the switch is turned from OFF to ON. Embodiments will be described hereinafter with reference to the drawings.

First Embodiment

A wireless transmission apparatus according to an embodiment will be described below with reference to FIG. 1. Referring to FIG. 1, input I/Q signals I and Q as signals to be modulated and transmitted, which are supplied from a baseband processor (not shown) or a controller 40, are input to input terminals 11 and 12. The input I/Q signals I and Q are synthesized with (added to or subtracted from) feedback I/Q signals FI and FQ (to be described later) by adders 13 and 14, thus generating synthesized I/Q signals. The synthesized I/Q signals are amplified by a baseband amplifier 15, and are then input to a quadrature modulator 16. The baseband amplifier 15 preferably uses a variable gain amplifier, and further includes a filter function required to assure the stability of the wireless transmission apparatus as needed.

The quadrature modulator 16 has mixers 17 and 18 and a 90° phase shifter 19 which generates quadrature local signals by phase-shifting an original local signal of a frequency fLO from a local oscillator 20, that is, two local signals having a 90° phase difference. The mixers 17 and 18 multiply the synthesized I/Q signals from the baseband amplifier 15 and the quadrature local signals, respectively. The quadrature modulator 16 generates a quadrature modulated signal by adding the output signals from the mixers 17 and 18.

The quadrature modulated signal output from the quadrature modulator 16 is input to a power amplifier 23 via a variable attenuator 21 and driver amplifier 22, and is amplified by the power amplifier 23 to a required power level, thereby generating a transmission RF signal. The transmission RF signal is supplied to an antenna 25 via a power coupler 24 as a power branch device, and is radiated from the antenna 25 into a space. A power of the transmission RF signal will be referred to as a transmission power hereinafter.

The output terminal of the power amplifier 23 is terminated by an antenna switch 26 via a termination element (a resistor R in this example), as needed. As the termination element, another linear element may be used in place of the resistor R. Note that the output terminal of the power amplifier 23 is terminated to ground GND of a transceiver via the resistor R in FIG. 1. Alternatively, when an isolator 37 is connected to the output terminal of the power amplifier 23, as shown in FIG. 2, the output terminal of the isolator 37 may be terminated by, for example, the resistor R. The following description will be given taking as an example the case in which the output terminal of the power amplifier 23 is terminated, as shown in FIG. 1, for the sake of simplicity.

The power coupler 24 branches a part of the transmission power to generate a feedback RF signal. The feedback RF signal is input to a quadrature demodulator 30 via a variable attenuator 27 and low-noise amplifier 28. The variable attenuator 27 is used as an amplitude adjustor for adjusting the amplitude of the feedback RF signal.

The quadrature demodulator 30 has mixers 31 and 32, and a 90° phase shifter 33 which generates quadrature local signals by phase-shifting an original local signal of a frequency fLO1, which is supplied from the local oscillator 20 via a variable phase shifter 29, that is, two local signals having a 90° phase difference. The variable phase shifter 29 is used as a phase adjustor for adjusting the phases of the quadrature local signals. The mixers 31 and 32 multiply the input feedback RF signal and quadrature local signals, respectively, thereby generating feedback I/Q signals FI and FQ.

The feedback I/Q signals FI and FQ are fed back to the adders 13 and 14 via a switch 34 having a polarity inversion function. The Cartesian loop is configured by a feedback loop including a feedback path of the power coupler 24→the variable attenuator 27→the low-noise amplifier 28→the quadrature demodulator 30→the adders 13 and 14, and a transmission path of the adders 13 and 14→the baseband amplifier 15→the quadrature modulator 16→ . . . →the power amplifier 23. The switch 34 is arranged to open/close this Cartesian loop and, more particularly, to set ON/OFF of inputs of the feedback I/Q signals FI and FQ to the adders 13 and 14. When the switch 34 is ON, the Cartesian loop is closed; when the switch 34 is OFF, the Cartesian loop is open.

Furthermore, an amplitude difference detector 35 which detects an amplitude difference between the feedback I/Q signals FI and FQ and the input I/Q signals I and Q, and a phase comparator 36 which detects a phase difference by comparing the phases of the feedback I/Q signals FI and FQ and the input I/Q signals I and Q are arranged. The amplitude difference detector 35 outputs an amplitude difference signal $V^D A$ which represents the amplitude difference between the feedback I/Q signals FI and FQ and the input I/Q signals I and Q. The phase comparator 36 outputs a phase difference detection signal $V^D \theta$ which mainly represents a phase difference between the feedback I/Q signals FI and FQ and the input I/Q signals I and Q. Note that in order to discriminate from a normalized phase difference signal CPHS (to be described later), $V^D \theta$ will be referred to as a composite phase difference detection signal.

The phase difference detector 35 and phase comparator 36 will be described in detail later. As will be described later, the phase comparator 36 includes a phase difference detector, amplitude normalizer, and limiter.

Figure 3:
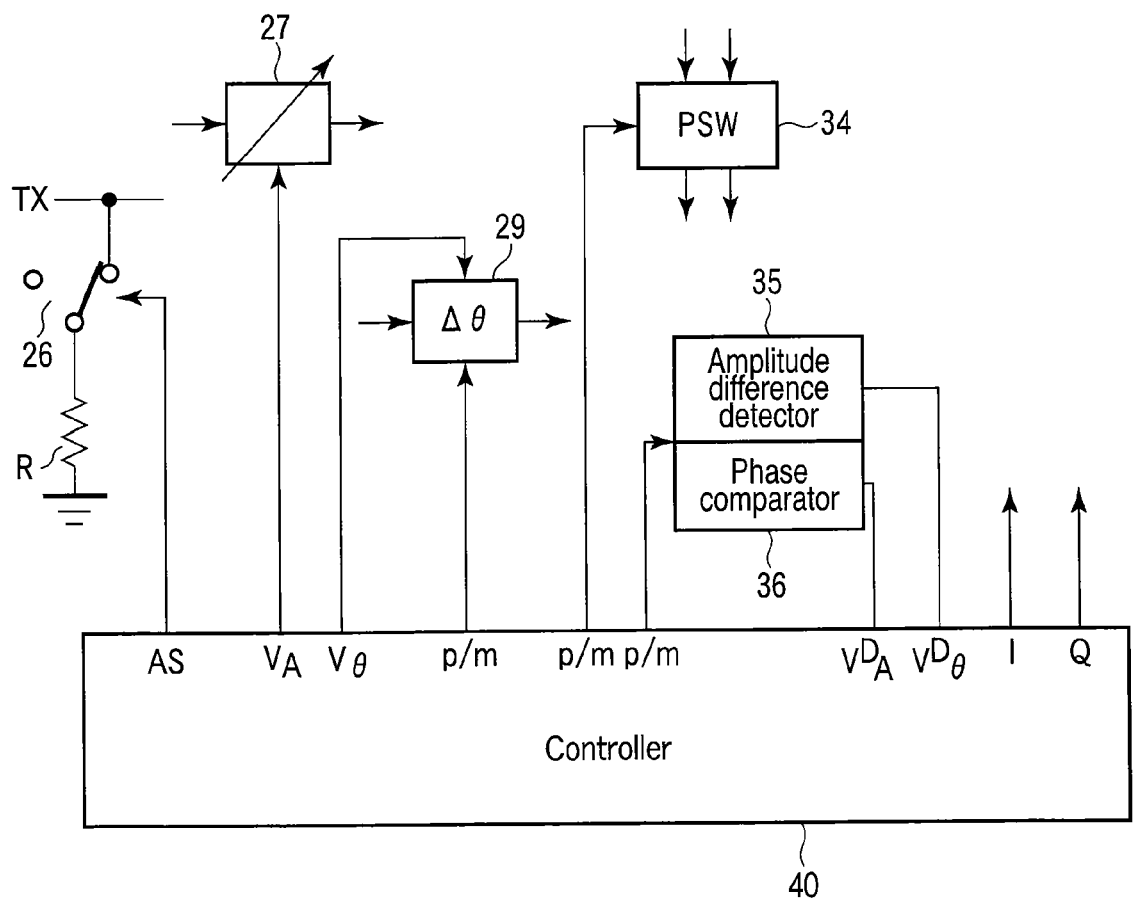
FIG. 3 is a block diagram for explaining functions of a controller.

When a calibration is performed, the switch 34 is turned off, that is, the Cartesian loop is open. A state in which the switch 34 is OFF will be referred to as a calibration mode hereinafter. When a signal is transmitted, the switch 34 is turned on, that is, the Cartesian loop is closed. Then, the feedback control by the Cartesian loop is applied. This state will be referred to as a transmission mode hereinafter. A controller 40 is configured to mainly control the Cartesian loop, as shown in, for example, FIG. 3. FIG. 3 shows that various control signals shown in FIG. 1 are output from the controller 40.

That is, the controller 40 outputs an amplitude control signal VA to the variable attenuator 27, a phase control signal Vθ to the variable phase shifter 29, and polarity switching signals p/m to the variable phase shifter 29, switch 34, amplitude difference detector 35, and phase comparator 36. The amplitude difference detection signal $V^D A$ from the amplitude difference detector 35 and the composite phase difference detection signal $V^D \theta$ from the phase comparator 36 are input to the controller 40. Furthermore, the controller 40 also outputs the input I/Q signals I and Q, and a control signal AS to the antenna switch 26. Note that the controller 40 need not always output the input I/Q signals I and Q as long as the types of signals used as the input I/Q signals I and Q can be controlled under the control from the controller 40.

(First Practical Example of Controller 40)

FIG. 4 shows a practical example of the controller 40, which has a control signal generator 41, digital-to-analog converter (DAC) 42, analog-to-digital converter (ADC) 43, and memory 44. Control signals of digital values, which are generated by the control signal generator 41, are converted into analog signals by the DAC 42, thereby generating the amplitude control signal VA and phase control signal Vθ. The amplitude control signal VA is supplied to the variable attenuator 27, and the phase control signal Vθ is supplied to the variable phase shifter 29.

On the other hand, the amplitude difference detection signal $V^D A$ from the amplitude difference detector 35 and the composite phase difference detection signal $V^D \theta$ from the phase comparator 36 are fetched by the ADC 43, and are converted from analog signals into digital values. The memory 44 is connected to the control signal generator 41 and ADC 43, and is used to store the amplitude difference detection signal and composite phase difference detection signal, which are converted into digital values by the ADC 43, and to output the stored amplitude difference detection signal and composite phase difference detection signal to the control signal generator 41.

(Second Practical Example of Controller 40)

According to another practical example of the controller 40, the ADC 43 is removed, as shown in FIG. 5, and the phase difference detector 35 and phase comparator 36 incorporate the ADC 43 instead. In this case, the ADC 43 is commonly used by the phase difference detector 35 and phase comparator 36, but it may be respectively incorporated in the phase difference detector 35 and phase comparator 36. According to the example of FIG. 5, the amplitude difference detection signal and composite phase difference detection signal of digital values are output from the phase difference detector 35 and phase comparator 36, and are directly fetched by the memory 44.

Although not shown in FIGS. 4 and 5, the controller 40 further includes a mode setting unit 45 for selectively setting the calibration mode and transmission mode, a loop gain setting unit 46, and a transmission power setting unit 47, as shown in FIG. 1.

This embodiment aims at minimizing the signal amplitude difference of the respective units before and after application of the feedback control, so as to shorten a response time due to opening/closing of the Cartesian loop. That is, this embodiment aims at estimating a signal amplitude after the feedback control by the Cartesian loop is applied, and setting that signal amplitude before the Cartesian loop is closed and the feedback control is applied. In order to achieve such processing, the amplitude and phase are adjusted in the following sequence before application of the feedback control by the Cartesian loop.

(Calibration Mode)

Figure 6:
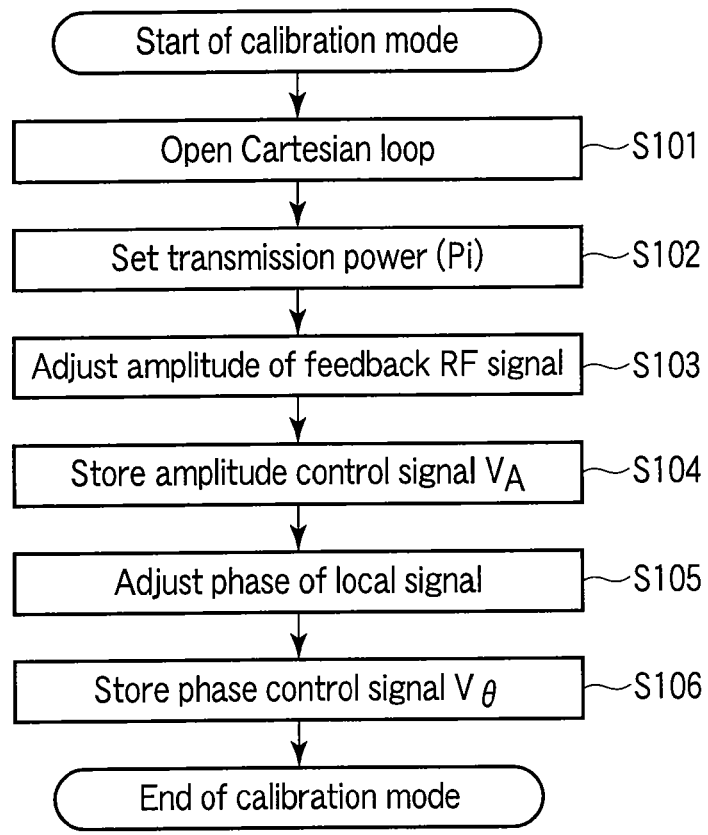
FIG. 6 is a flowchart showing the processing sequence of a calibration mode.

The processing sequence in the calibration mode will be described below using FIG. 6. The sequence shown in FIG. 6 is controlled by the controller 40.

When the calibration mode is started, the Cartesian loop is opened since the switch 34 is turned off (step S101). At this time, the output terminal of the power amplifier 23 or that of the isolator 37 is terminated by the resistor R using the antenna switch 26, so as not to output the transmission RF signal from the antenna 25. To the antenna switch 26, the control signal AS used to control whether or not to terminate the output terminal of the power amplifier 23 or that of the isolator 37 is supplied from the controller 40.

The controller 40 recognizes a desired transmission power (let Pi be this power) set by the power setting unit 47. When the controller 40 sets an attenuation amount of the variable attenuator 21 for transmission according to Pi in an open state of the Cartesian loop, the desired transmission power Pi is set (step S102). At this time, when the transmission power is at maximum output, the transmission RF signal is distorted. However, in the calibration mode, no problem is posed even when a distortion is large.

The feedback RF signal as a partial power of the transmission RF signal is input to the quadrature demodulator 30 via the power coupler 24, variable attenuator 27, and low-noise amplifier 28, thus generating the feedback I/Q signals FI and FQ. The amplitude difference detector 35 detects an amplitude difference ΔA between the feedback I/Q signals FI and FQ and the input I/Q signals I and Q, and the controller 40 sets the amplitude control signal VA to the variable attenuator 27 so as to minimize this amplitude difference ΔA.

Note that the amplitude of the input I/Q signals I and Q is defined by a root of $I^2+Q^2$, and that of the feedback I/Q signals FI and FQ is defined by a root of $FI^2+FQ^2$. In this case, assume that the amplitude of the input I/Q signals I and Q is $I^2+Q^2$, and that of the feedback I/Q signals FI and FQ is $FI^2+FQ^2$, for the sake of simplicity.

In order to equalize the amplitude of the feedback I/Q signals FI and FQ and that of the input I/Q signals I and Q, the controller 40 controls the attenuation amount of the variable attenuator 27 so that the amplitude difference detection signal $V^DA$ output from the amplitude difference detector 35 approaches 0. Note that $V^DA$ is expressed by:

$$V^DA = (FI^2+FQ^2) - (I^2+Q^2) \quad (1)$$

The amplitude difference detection signal $V^DA$ may be calculated by multiplying the right-hand side of equation (1) by a constant. Equation (1) corresponds to a case in which a constant to be multiplied by the right-hand side is 1.

As shown in FIGS. 4 and 5, when the amplitude control signal VA, which is supplied from the controller 40 to the variable attenuator 27, is an analog signal generated by the DAC 42, a digital value, which is input from the control signal generator 41 to the DAC 42 at the time of generation of the amplitude control signal VA, is sequentially increased or decreased. As a result, the amplitude control signal VA, which increases or decreases monotonically (to be referred to as an amplitude calibration control signal hereinafter), is generated, and the amplitude of the feedback RF signal is adjusted by this amplitude calibration control signal (step S103). Then, the amplitude difference detector 35 detects the amplitude difference between the feedback I/Q signals and input I/Q signals, and outputs the amplitude difference detection signal $V^DA$. The amplitude calibration signal, which is closest to a zero-crossing point of the amplitude difference detection signal $V^DA$, that is, the signal upon switching $V^DA$ from positive to negative or vice versa, gives a desired amplitude adjustment amount. Then, the amplitude of the transmission RF signal is nearly equal to that of the feedback RF signal. In other words, a loop gain (to be described later) becomes nearly 1. The amplitude calibration control signal closest to the zero-crossing point of the amplitude difference detection signal $V^DA$ is used as the amplitude control signal VA which minimizes the amplitude difference between the feedback I/Q signals and input I/Q signals.

The amplitude control signal VA generated in this way is converted into a digital value by the ADC 43, and that digital value is stored in the memory 44 so as to be used in the next phase adjustment and in the transmission mode later (step S104). The digital value stored in the memory 44 is read out in the next phase adjustment, and is set in the variable attenuator 27 via the control signal generator 41 and DAC 42.

After the amplitude control signal VA is stored in the memory 44 in step S104, the variable phase shifter 29 is controlled by the phase control signal Vθ, which is output from the controller 40 based on a phase difference θ detected by the phase comparator 36. Then, the phase of the local signals supplied to the quadrature demodulator 30, in other words, that of the feedback I/Q signals is adjusted (step S105).

Figure 7:
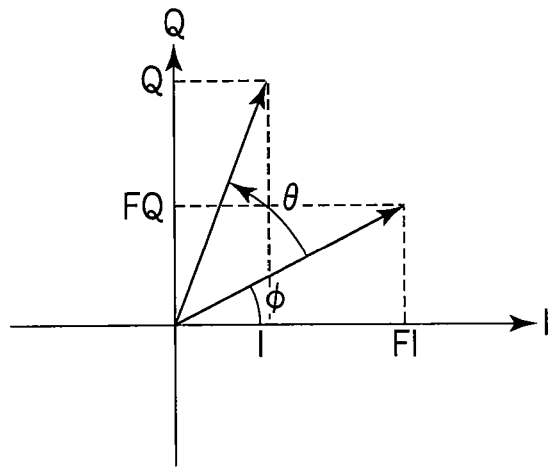
FIG. 7 is a graph showing the relationship between input I/Q signals and feedback I/Q signals.

FIG. 7 plots the input I/Q signals I and Q and the feedback I/Q signals FI and FQ on an I-Q plane. Assume that $I^2+Q^2=FI^2+FQ^2$ under the aforementioned attenuation amount control of the variable attenuator 27. Since a phase difference between vectors (I, Q) and (FI, FQ) is θ, we have:

$$I = FI \cos θ - FQ \sin θ \quad (2)$$

$$Q = FI \sin θ + FQ \cos θ \quad (3)$$

If a phase difference detection signal PHS which represents the phase difference θ between the input I/Q signals I and Q and the feedback I/Q signals FI and FQ is given by FI×Q−FQ×I, PHS is expressed as follows:

$$\begin{aligned} PHS &= FI \times Q - FQ \times I \quad (4) \\ &= FI^2 \sin θ + FI \times Q \cos θ - \{FI \times FQ \cos θ - FQ^2 \sin θ\} \\ &= \sin θ \{FI^2(t) + FQ^2(t)\} \end{aligned}$$

On the other hand, in order to detect that the phase difference θ is zero or is shifted by π, a sign detection signal PL is defined. The sign detection signal PL is given by:

$$\begin{aligned} PL &= FI(t)I(t) + FQ(t)Q(t) \quad (5) \\ &= FI^2 \cos θ - FIFQ \sin θ + FIFQ \sin θ + FQ^2 \cos θ \\ &= \cos θ \{FI^2(t) + FQ^2(t)\} \end{aligned}$$

When $FI^2+FQ^2 \gg 0$, the phase difference θ is around zero or π when the phase difference signal PHS is around 0. In order to determine this difference, the value PL in equation (5) is referred to. When θ is around 0, PL assumes a positive value; when θ is around π, PL assumes a negative value.

In order to detect θ=0°, the phase control signal Vθ is sequentially increased, and the values of the phase difference detection signal PHS and sign detection signal PL are detected. In this case, when the phase control signal Vθ supplied from the controller 40 to the variable phase shifter 29 is an analog signal output from the DAC 42, a digital value input from the generator 41 to the DAC 42 at the time of generation of the phase control signal Vθ is sequentially increased or decreased. As a result, the phase control signal Vθ, which increases or decreases monotonically (to be referred to as a phase calibration control signal hereinafter), is generated, and the phase calibration control signal which sets the phase difference detection signal PHS to be nearly 0° is calculated as the phase control signal Vθ which minimizes the phase difference θ between the feedback I/Q signals and input I/Q signals during this process. Furthermore, according to the sign of the sign detection signal PL at this time, the switch 34 controls the polarity of the feedback I/Q signals FI and FQ to be fed back to the adders 13 and 14. In FIG. 1, the polarity of the feedback I/Q signals FI and FQ can be set based on the polarity switching signal p/m output from the controller 40. If the sign detection signal PL is positive, the polarity of the feedback I/Q signals FI and FQ is set to be positive; if PL is negative, the polarity of the feedback I/Q signals FI and FQ is set to be negative.

The phase control signal Vθ as the phase calibration control signal around θ=0, which is obtained by the above operation, is converted into a digital value by the ADC 43, and is stored in the memory 44 as a digital value to be used in the transmission mode later (step S106), thus ending the calibration mode.

The above description has been given under the assumption of $FI^2+FQ^2>>0$. However, when $FI^2+FQ^2>>0$ does not hold, the phase difference detection signal PHS assumes a value around 0 even when θ does not assume a value around θ=0°. Therefore, when the calibration is executed using modulation signals, that is, the input I/Q signals I and Q without using tone signals having a constant amplitude, a detection error of the phase difference θ becomes large. However, since $FI^2+FQ^2$ assumes a positive value, the polarity can be accurately judged. In order to reduce the detection error of the phase difference θ, a normalized phase difference signal CPHS as a signal of sin θ, which does not depend on amplitude signals of transmission waves, can be generated by normalizing the phase difference detection signal PHS by dividing it by, for example, the amplitude $FI^2+FQ^2$ of the input I/Q signals. That is, the normalized phase difference signal CPHS is expressed by:

$$CPHS = PHS/A_1(FI^2+FQ^2) = \sin\theta/A_1 \quad (6)$$

where $A_1$ is a coefficient.

The value of the phase control signal Vθ, which is around θ=0°, is stored in the memory 44 according to, for example, successive approximation using the normalized phase difference signal CPHS given by equation (6). The calibration mode has been described. Note that the composite phase difference detection signal $V^D\theta$ means a pair of the normalized phase difference signal CPHS and sign detection signal PL.

The operations of the aforementioned calibration mode will be summarized below. In the open state of the Cartesian loop, the amplitude control signal VA to be supplied to the variable attenuator 27 is adjusted so as to obtain a predetermined loop gain (loop gain=1 in this case) around the desired transmission power (Pi). The phase control signal Vθ to be supplied to the variable phase shifter 29 is adjusted so that the phase difference between the feedback I/Q signals and input I/Q signals becomes 180°. Since the phase adjustment is executed after the amplitude adjustment, the phase adjustment can be precisely executed.

(Transmission Mode)

Figure 8:
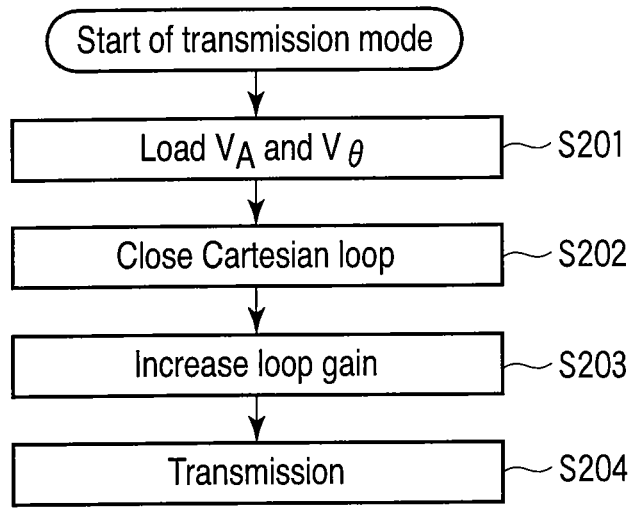
FIG. 8 is a flowchart showing the processing sequence of a transmission mode.

The processing sequence in the transmission mode will be described below using FIG. 8. The sequence shown in FIG. 8 is also controlled by the controller 40. When the transmission mode starts, the amplitude control signal VA and phase control signal Vθ are loaded from the memory 44, and are set in the variable attenuator 27 and variable phase shifter 29 (step S201). Next, the Cartesian loop is closed by turning on the switch 34 (step S202). At this time, the output terminal of the power amplifier 23 or that of the isolator 37 is terminated via the resistor R as needed.

After that, the loop gain is increased (step S203) to perform transmission (step S204). It is set that the switch 26 is switched simultaneously with closing of the Cartesian loop in step S202 to abort termination of the output terminal of the power amplifier 23 or that of the isolator 37 and to connect the antenna 25 instead. Alternatively, in consideration of a transient response time, after a delay of the transient response time since the Cartesian loop is closed, termination of the output terminal of the power amplifier 23 or that of the isolator 37 is aborted.

Figure 9:
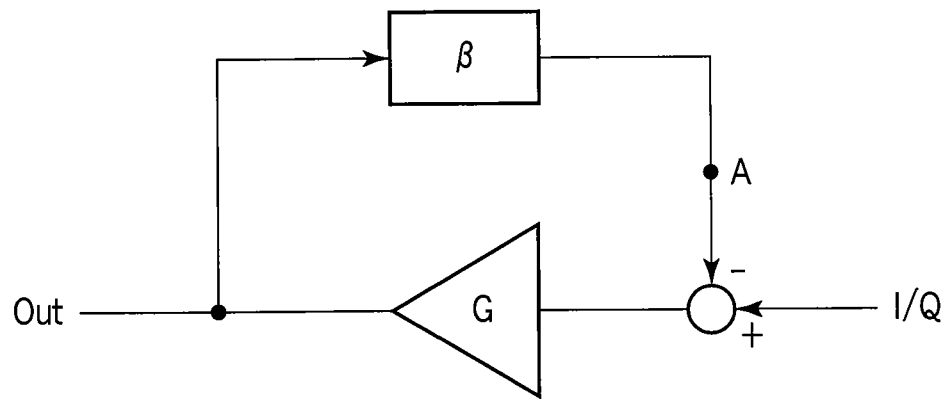
FIG. 9 is a schematic diagram showing a feedback system for explaining the Cartesian loop.

The significance of the loop gain increasing processing in step S203 will be explained below. Although the Cartesian loop is a two-dimensional loop of I and Q, it is considered as a linear loop for the sake of simplicity, and a linear feedback system shown in FIG. 9 is assumed. In general, in the feedback system, letting G be a gain of an amplification stage (naked gain), β be a feedback rate, I/Q be an input, and Out be an output, the following relation is established:

$$Out = \frac{G}{1+G\beta} I/Q \approx \frac{1}{\beta} I/Q \quad (7)$$

A gain after the feedback control is expressed by G/(1+Gβ). Gβ is called a loop gain. When 1+Gβ=0, since the denominator assumes zero, the feedback system becomes unstable. 1+Gβ=0 is a state in which Gβ=1 and a phase is turned through 180° when the feedback signal is subtracted from the input signal. The feedback control has to be applied under the condition that a frequency that yields such state does not exist. In the amplitude and phase adjustments described so far, when the Cartesian loop is closed, since 1+Gβ=2, not only is the gain halved, but also improvement of a distortion cannot be expected.

On the other hand, when the control transits to the transmission mode after completion of the aforementioned calibration mode, and the Cartesian loop is closed to apply the feedback control, a state equivalent to that of Gβ=1 shown in FIG. 9 is set. Hence, in the sequence shown in FIG. 8, after the amplitude control signal VA and phase control signal Vθ corresponding to the transmission power, which is set in advance, are loaded in step S201, the Cartesian loop is closed in step S202, and the loop gain Gβ is increased to be larger than 1 in step S203, so as to reduce the influence of G. More specifically, the switch 34 is turned on to switch the open state of the Cartesian loop to the closed state of the Cartesian loop to have a predetermined polarity, and the loop gain Gβ is increased.

An adjustment target required to change the loop gain Gβ is G corresponding to the gain from the baseband amplifier 15 to the power amplifier 23, and it is desirable to keep β unchanged. This is because since β corresponds to a gain when the Cartesian loop is applied, if it is changed, the gain to be set unwantedly changes. In this embodiment, in order to increase the gain G, the gain of the baseband amplifier 15 is increased by the loop gain setting unit 46, as shown in FIG. 1. In this case, since the loop gain Gβ=1 in the open state of the Cartesian loop, a change amount of the gain of the baseband amplifier 15 corresponds to the loop gain of the whole system.

Assuming that the loop gain is sufficiently larger than 1, the desired transmission output is decided based on the attenuation amount (amplitude adjustment amount) of the variable attenuator 27 in the feedback path, which amount is set in the open state of the Cartesian loop in the calibration mode. Since the amplitude of the feedback I/Q signals FI and FQ becomes equal to that of the input I/Q signals I and Q as a result of the setting of such amplitude adjustment amount, the gain from the input terminals 11 and 12 to the output terminal of the power amplifier 23 (that of the transmission output with respect to the input I/Q signals I and Q) becomes equal to that of the feedback path of the Cartesian loop (an inverse of the attenuation amount). Therefore, the transmission output need not be adjusted after the Cartesian loop is closed.

When the process in step S203 is executed, the amplitude of the feedback I/Q signals is set to be nearly the same amplitude as that in the open state of the Cartesian loop, and a transient response time when the Cartesian loop is closed is further shortened.

FIG. 10 shows a transient response (T1) of the transmission power when the Cartesian loop is closed without any processes in the sequences described using FIGS. 6 and 8, and a transient response (T2) of the transmission power when the transmission power is changed while the Cartesian loop is closed (when the transmission power is set after the Cartesian loop is closed). According to this embodiment, these transient responses can be improved.

(Transmission End Processing)

Processing at the transmission end timing will be described below. At the transmission end timing, transmission baseband signals I and Q are ramped down to decrease the transmission power. After the transmission power is decreased to a predetermined level, the switch 34 is turned off to open the Cartesian loop. Next, the operation of the Cartesian loop is stopped, and the increment of the loop gain is also reverted. For example, by reverting the gain of the baseband amplifier 15 to the setting before application of the feedback control by the Cartesian loop, the loop gain can be restored to 1.

(Transmission Power Change Processing)

Processing upon changing the transmission power will be described below. When a transmission power level is set to be smaller by a given level or more, since the linearization using the Cartesian loop is not required, the operation of the Cartesian loop is stopped. In this case, the same sequence as that at the transmission stop timing is adopted.

Alternatively, in the first step, the switch 34 is turned off to open the Cartesian loop, and the gain G is decreased. That is, the increment of the loop gain, which was required to reduce a gain deviation, is reverted. For example, the gain of the baseband amplifier 15 is reverted. Next, the Cartesian loop is stopped in the second step.

When the transmission power level is changed but the operation of the Cartesian loop is required, the following processing is executed. After the sequence up to the first step, the transmission power which imitates that after the gain is changed is set in the open state of the Cartesian loop, and the phase adjustment is executed in the sequence of the calibration mode described using FIG. 6. After that, the control transits to the transmission mode. Alternatively, $\beta$ may be decreased to a predetermined level while maintaining the transmission mode, and the gain G of the amplification stage may be increased by a decrement of $\beta$.

According to the calibration mode shown in FIG. 6 the amplitude and phase are adjusted immediately before the transmission operation shown in FIG. 8. Therefore, fetching the amplitude control signal and phase control signal before the Cartesian loop is applied or before the transmission power is changed is performed based on a test made in an open loop.

By contrast, another calibration mode to be described below aims at further shortening a calibration time before transmission, and assumes that the calibration mode is executed at the startup timing of the wireless transmission apparatus or the delivery inspection timing of an integrated circuit (IC) on which the wireless transmission apparatus is mounted. Therefore, the calibration mode to be described below will be referred to as startup calibration for the sake of convenience, but its execution timing is not limited to the startup timing.

(Startup Calibration Mode)

FIG. 11 shows the processing sequence in the startup calibration mode. In FIG. 11, the transmission output is changed stepwise to adjust and store the amplitude control signals VA and phase control signals V$\theta$ corresponding to the respective transmission outputs, unlike in FIG. 6.

When the calibration mode is started, the switch 34 is turned off to open the Cartesian loop (step S111). At this time, the output terminal of the power amplifier 23 or that of the isolator 37 is terminated by the resistor R using the antenna switch 26, so as not to output any transmission RF signal from the antenna 25.

After i=1 is set in step S112, a transmission power Pi is set (step S113). Initially, Pi=1 is set. After that, the amplitude adjustment of the feedback RF signal (step S114), the storage of the amplitude control signal VA (step S115), the phase adjustment of the feedback I/Q signals (local signals) (step S116), and the storage of the phase control signal V$\theta$ (step S117) are executed in the same manner as in steps S103 to S106 in FIG. 6.

The processes in steps S113 to S117 are repeated by incrementing i by 1 in step S119 until it is determined in step S118 that i=I. At this time, in transmission power setting step S113, the transmission power is raised by, for example, a 1-dB step every time is incremented by 1. The amplitude control signals VA and phase control signals V$\theta$, which are adjusted in correspondence with the respective transmission outputs in this way, are stored in the memory 44, thus ending the startup calibration mode.

(Transmission Mode)

Processing executed when the Cartesian loop is applied during transmission after execution of the startup calibration described using FIG. 11 will be described below using FIG. 12. Initially, the switch 34 is turned off to start the operation in the open state of the Cartesian loop, and a desired transmission power Pi is set (step S211).

In steps S115 and S117 in FIG. 11, the amplitude control signals VA and phase control signals V$\theta$ corresponding to respective transmission powers Pi (i=1 to I) are stored in the memory 44. Hence, the amplitude control signal VA and phase control signal V$\theta$ corresponding to the transmission power set in step S211 are loaded from the memory 44, and are set in the variable attenuator 27 and variable phase shifter 29 (step S212). At this time, the output terminal of the power amplifier 23 or that of the isolator 37 is kept terminated via the resistor R.

After that, after an elapse of a predetermined time, the switch 34 is turned on to close the Cartesian loop (step S213). At this time, termination of the output terminal of the power amplifier 23 or that of the isolator 37 is aborted.

Next, as in step S203 in FIG. 8, a high gain of the baseband amplifier 15 is set to increase the loop gain (step S214), and the transmission is started (step S215).

Since the transmission end processing and the transmission power change processing are the same as those described above, a description thereof will not be repeated. However, when the transmission power is to be changed, and the operation of the Cartesian loop is required, the switch 34 is turned off to open the Cartesian loop in the first step, and the gain G is decreased in the second step. That is, the increment of the loop gain is reverted. Since the amplitude control signals VA and phase control signals V$\theta$ have already been stored in the memory 44, after the Cartesian loop is operated in the sequence up to the second step, the transmission can be executed at the predetermined transmission power in the sequence shown in FIG. 12. Alternatively, $\beta$ may be decreased to a predetermined level while maintaining the transmission mode, and the gain G of the amplification stage may be increased by a decrement of β.

In the startup calibration mode described using FIG. 11, an initial value is given to a digital value of a control signal to be generated by the control signal generator 41 in the controller 40 shown in FIG. 4 or 5. In this state, the amplitude difference detection signal $V^DA$ and composite phase difference detection signal $V^D\theta$ obtained by the phase difference detector 35 and phase comparator 36 in this state are stored in the memory 44 via the ADC 43 as digital values.

Next, the digital value of the control signal is incremented by one step, and the amplitude difference detection signal $V^DA$ and composite phase difference detection signal $V^D\theta$ obtained by the phase difference detector 35 and phase comparator 36 at that time are similarly stored in the memory 44 as digital values. The same processing is repeated the predetermined number of times (N times). From the digital values of the amplitude difference detection signals $V^DA$ stored in the memory 44 in this way, a digital value when $V^DA$ given by equation (1) assumes 0 or a value closest to 0 is selected, and is fetched by the control signal generator 41 to generate the amplitude control signal VA.

On the other hand, from the digital values of the composite phase difference detection signals $V^D\theta$ stored in the memory 44, a digital value when the sign detection signal PL given by equation (5) indicates a predetermined sign or when PHS given by equation (4) assumes 0 or a value closest to 0 is selected, and is received by the control signal generator 41 to generate the phase control signal Vθ. Of the digital values of the amplitude difference detection signals $V^DA$ and composite phase difference detection signals $V^D\theta$ stored in the memory 44, pieces of unnecessary information, for example, pieces of information other than the selected digital values of the detection signals may be discarded.

The aforementioned method will be referred to as an adjustment method based on digital feedback control since it is based on the feedback control executed via the controller 40. The above description has been given under the assumption that $V^DA$, PHS, and CPHS given by equations (1), (4), and (6) are calculated as analog signals. Alternatively, after I, Q, FI, and FQ are converted into digital values by the ADC 43 shown in, for example, FIG. 5, $V^DA$, PHS, and CPHS may be calculated by digital calculations.

As described above, according to the first embodiment, in a state in which the Cartesian loop is open and a desired transmission power is set, the amplitude control signal and phase control signal, which minimize amplitude and phase errors, are generated, and are stored in the memory 44. In the transmission mode, the amplitude control signal and phase control signal are loaded from the memory 44, and are set in the variable attenuator 27 which executes the amplitude adjustment of the feedback RF signal and the variable phase shifter 29 which adjusts the phase of local signals used in quadrature demodulation in the feedback circuit. Therefore, since transmission power difference between the open and closed states of the Cartesian loop can be reduced, a transient response time of the transmission power upon switching the Cartesian loop from the open state to the closed state can be effectively shortened.

Second Embodiment

In the first embodiment, in the method of the amplitude adjustment and phase adjustment in the calibration mode based on digital feedback control, the feedback control is executed via a controller 40. However, in the calibration mode, an amplitude control signal and phase control signal required in the transmission mode can be generated by only analog processing without the intervention of the controller 40. However, since the control signals obtained by the analog processing are analog signals, the analog control signals have to be input to the controller 40 to be converted into digital values by an ADC 43, and the digital values have to be stored in a memory 44 for the transmission mode later.

A method of generating an amplitude control signal and phase control signal by analog feedback control according to the second embodiment will be described below using FIG. 13. FIG. 13 shows some components common to FIG. 1, and newly added switches 51 and 52 in a control signal feedback loop. In the calibration mode, an amplitude control signal VA and phase control signal Vθ are generated as follows.

A method of generating the amplitude control signal VA by analog feedback control will be described first. A switch 34 in a feedback circuit of the Cartesian loop is kept OFF, and the output terminal of a power amplifier 23 or that of an isolator 37 is terminated. To a variable attenuator 27 in a feedback path of the Cartesian loop, a weak partial power branched from a transmission RF signal as an output from the power amplifier 23 is input as a feedback RF signal. Also, assume that the power supply of the feedback circuit of the Cartesian loop is already turned on. At the time of the amplitude adjustment of the feedback RF signal, the switch 51 is ON, and the switch 52 is OFF. Assume that a predetermined reference control is applied to a variable phase shifter 29 when the switch 52 is OFF.

In an amplitude difference detector 35 and phase comparator 36, processing of equation (1) is executed for input I/Q signals I and Q and feedback I/Q signals FI and FQ by analog processing as in the first embodiment. Then, an analog amplitude difference detection signal $V^DA$ (or a signal corresponding to a constant multiple of $V^DA$) is input to the variable attenuator 27 as an amplitude control signal VA (to be referred to as an amplitude calibration control signal hereinafter). That is, by a feedback loop of the variable attenuator 27→a low-noise amplifier 28→a quadrature demodulator 30→the amplitude difference detector 35, a stabilization point of VA can be approximated to a point of FI=I and FQ=Q.

For example, assuming that a signal amplitude of an input terminal RXIN of the variable attenuator 27 is large, and an amplitude mM of a vector (FI, FQ) is sufficiently larger than an amplitude M of a vector (I, Q), $V^DA$ assumes a large positive value according to equation (1), and this $V^DA$ is fed back to the amplitude control signal VA to the variable attenuator 27. Assume that it is designed as a characteristic of the variable attenuator 27 that an attenuation amount increases with increasing amplitude control signal VA. Since large $V^DA$ is input as the amplitude control signal VA, the attenuation amount of the variable attenuator 27 increases. Then, the amplitude mM becomes small, and is converged to a value nearly equal to the amplitude M. The converged value of the amplitude mM is fetched in the controller 40 via the ADC 43 as a digital value, and the digital value is stored in the memory 44. After that, the switch 51 is turned off, and the controller 40 inputs the amplitude control signal VA to the variable attenuator 27. This process will be described later.

Next, a method of similarly generating the phase control signal Vθ by analog feedback control will be described below. At the time of the phase adjustment, the switch 51 is OFF, and the switch 52 is ON. When the switch 52 is ON, a phase control loop including the variable phase shifter 29→the quadrature demodulator 30→the phase difference adjustor 35 is formed.

In this phase control loop, a phase difference θ between the vectors (FI, FQ) and (I, Q) is detected according to equation (4). When the phase difference between the vectors (FI, FQ) and (I, Q) is in-phase or anti-phase, since sin θ=0 is satisfied, it is converged at that point. However, whether θ is 0° or π cannot be discriminated. Hence, this discrimination is made based on a value of cos θ in equation (5). That is, if cos θ is positive, 0°, i.e., in-phase is determined; if it is negative, it, i.e., anti-phase is determined. The values Vθ and cos θ are fetched in the controller 40 via the ADC 43, and are stored in the memory 44.

When the Cartesian loop is closed, the switch 34 is turned on, and the polarity of connection is selected by the switch 34 according to that of cos θ. On the other hand, as for the phase control signal Vθ, after the switch 52 is turned off, the same voltage as that detected by the ADC 43 is generated as the phase control signal Vθ via a control signal generator 41 and DAC 42.

The values of the amplitude control signal VA and phase control signal Vθ stored in the memory 44 in this way are used in the transmission mode. The amplitude control signal VA stored in the memory 44 is also used to adjust the phase control signal Vθ in the calibration mode.

The controller 40 will be described below. As shown in FIG. 13, the DAC 42 of the controller 40 is connected to the variable attenuator 27 and variable phase shifter 29 via switches 53 and 54, and the ADC 43 is connected to the amplitude difference detector 35 and phase comparator 36 via the switches 51 and 52. When the switch 51 is turned on, the amplitude control signal VA is fetched by the memory 44 via the ADC 43 of the controller 40. When the switch 52 is turned on, the phase control signal Vθ is fetched by the memory 44 via the ADC 43. At the beginning of the transmission mode, when the switch 53 is turned on, the amplitude control signal VA is loaded onto the variable attenuator 27, and when the switch 54 is turned on, the phase control signal Vθ is loaded onto the variable phase shifter 29 via the DAC 43.

Practical examples of the respective components in the Cartesian loop in the first and second embodiments will be described below.

(Practical Example of Variable Attenuator)

Figure 14:
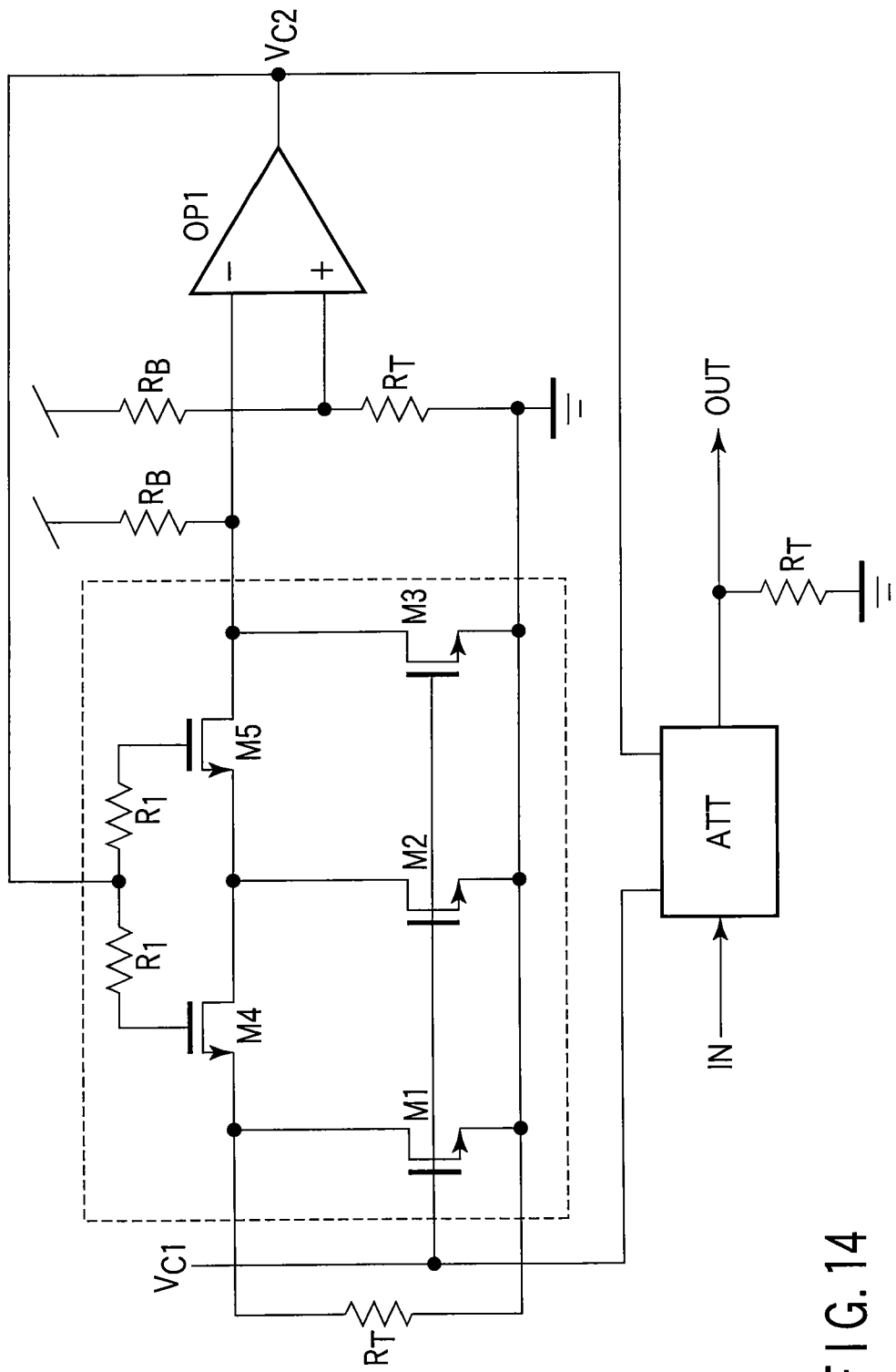
FIG. 14 is a circuit diagram showing a practical example of a variable attenuator.

FIG. 14 shows a practical example of a variable attenuator. A block bounded by the broken line in FIG. 14 is a dummy attenuator, and a block denoted by ATT is an attenuator having the same circuit as the dummy attenuator. The dummy attenuator is a variable attenuator including MOSFETs M1 to M5, and resistors R1 and R2. The following description will be given under the assumption that the attenuator ATT includes MOSFETs M1 to M5, and resistors R1 and R1 since it has the same arrangement as the dummy attenuator.

The MOSFETs M1, M2, and M3 form a path that shunts a signal to ground GND, and control an amount of a signal flowing to the ground GND. On the other hand, the MOSFETs M4 and M5 form a through path, and control an amount of a signal to be transferred to a circuit in the next stage. The resistors R1 are used to transfer DC components to the gate terminals of M4 and M5.

One terminal of each of resistors RB and RT is connected to a + input terminal of an operational amplifier OP1, the other terminal of RB is connected to a power supply VDD, and the other terminal of RT is connected to the ground GND. One terminal of the resistor RB is connected to VDD, and the other terminal is connected to the drain terminal of the MOSFET M5 of the dummy attenuator. One terminal of the resistor RT is connected to GND, and the other terminal is connected to the source terminal of the MOSFET M4 of the dummy attenuator. A common terminal of the two resistors R1 of the dummy attenuator is connected to the output terminal of the operational amplifier OP1, and a common terminal of the resistors R1 of the attenuator ATT. A gain control signal VC1 is supplied to the gate terminals of the MOSFETS M1, M2, and M3 in the dummy attenuator and attenuator ATT.

According to the arrangement shown in FIG. 14, the gain control signal VC1 and the gain (=OUT/IN) of the attenuator ATT exhibit linear-in-dB characteristics, as described in reference H. Dogan, et. al., "A DC-10 GHz Linear-in-dB Attenuator in 0.13 µm CMOS Technology," IEEE 2004 CICC, pp. 609-612.

(Threshold Fluctuation Compensation Interface)

In the variable attenuator shown in FIG. 14, when a threshold fluctuation (Vth fluctuation) is caused by a process fluctuation of the MOSFET, the resistance of the MOSFET is changed even when the gain control signal VC1 is constant. This is because the output resistance of the MOSFET depends on a value obtained by subtracting a threshold voltage Vth from a gate-source voltage VGS. Also, in a variable phase shifter (to be described later), a Vth fluctuation of a MOSFET often poses a problem.

Figure 15:
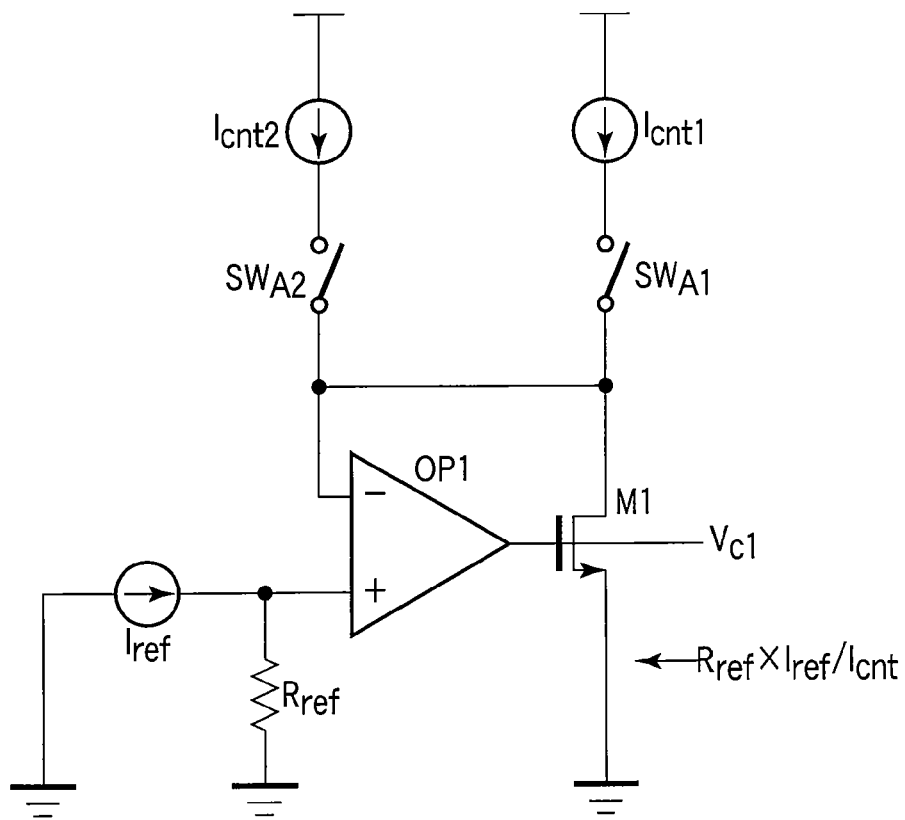
FIG. 15 is a circuit diagram showing an interface with process fluctuation compensation.

FIG. 15 shows an example of a circuit for compensating for such Vth fluctuation of the MOSFET. A Vth fluctuation compensation circuit shown in FIG. 15 is inserted as an interface on one or both of the input side of the amplitude control signal VA of the variable attenuator 27 in, for example, FIG. 13 and the input side of the phase control signal Vθ of the variable phase shifter 29 in FIG. 13.

The circuit shown in FIG. 15 is configured to compensate for a Vth fluctuation of a MOSFET M1 basically by using a reference voltage Iref×Rref generated based on a reference current Iref and a reference resistor Rref, and a control current Icnt (Icnt1, Icnt2). In this case, the control current Icnt expresses the amplitude control signal VA or phase control signal Vθ as a current signal.

When a switch SWA1 is ON and a switch SWA2 is OFF, only Icnt1 of control currents Icnt1 and Icnt2 prepared for two systems flows into the MOSFET M1 via the switch SWA1. The reference voltage Iref×Rref is supplied to a non-inverting input terminal of the operational amplifier OP1, the output terminal of OP1 is connected to the gate terminal of the MOSFET M1, and the drain terminal of M1 is connected to an inverting input terminal of OP1. Due to the operation of such feedback system, the drain voltage of the MOSFET M1 is controlled to be equal to the reference voltage Iref×Rref. Therefore, when the threshold voltage Vth of the MOSFET M1 is increased, the gate-source voltage VGS of M1 is automatically increased by an increment of Vth, thus compensating for a Vth fluctuation.

The reason why the two switches SWA1 and SWA2 and the two control currents Icnt1 and Icnt2 are used will be described below. According to the second embodiment shown in FIG. 13, the amplitude difference detection signal $V^D A$ from the amplitude difference detector 35 is supplied to the variable attenuator 27 as the amplitude control signal VA in the calibration mode and phase adjustment mode, and the composite phase difference detection signal $V^D \theta$ from the phase comparator 36 is supplied to the variable phase shifter 29 as the phase control signal Vθ in the calibration mode. On the other hand, in the transmission mode, the controller 40 outputs digital values stored in the memory 44 as the amplitude control signal VA and phase control signal Vθ via the DAC 42, and these signals are respectively supplied to the variable attenuator 27 and variable phase shifter 29.

As described above, especially in the case of the second embodiment shown in FIG. 13, control signal paths to the variable attenuator 27 and variable phase shifter 29 are different in the calibration mode and transmission mode. When the Vth fluctuation interface shown in FIG. 15 is used, control signal paths of two systems can be respectively formed for the variable attenuator 27 and variable phase shifter 29.

In FIG. 13, the switches 51 and 52 are arranged, but they can be substituted by, for example, the switch SWA1 in FIG. 15. On the other hand, ON/OFF of SWA2 in FIG. 15 corresponds to, for example, ON/OFF of transmission of the amplitude control signal VA and phase control signal Vθ from the controller 40 to the variable attenuator 27 and variable phase shifter 29.

Therefore, when SWA1=ON and SWA2=OFF in the calibration mode, the amplitude difference detection signal $V^D A$ from the amplitude difference detector 35 is supplied to the variable attenuator 27 as the amplitude control signal VA, and the composite phase difference detection signal $V^D\theta$ from the phase comparator 36 is supplied to the variable phase shifter 29 as the phase control signal Vθ. On the other hand, conversely, when SWA1=OFF and SWA2=ON in the transmission mode, the amplitude control signal VA from the controller 40 is supplied to the variable attenuator 27, and the phase control signal Vθ from the controller 40 is supplied to the variable phase shifter 29.

(Local Signal Supply Path for Quadrature Demodulator)

Figure 16:
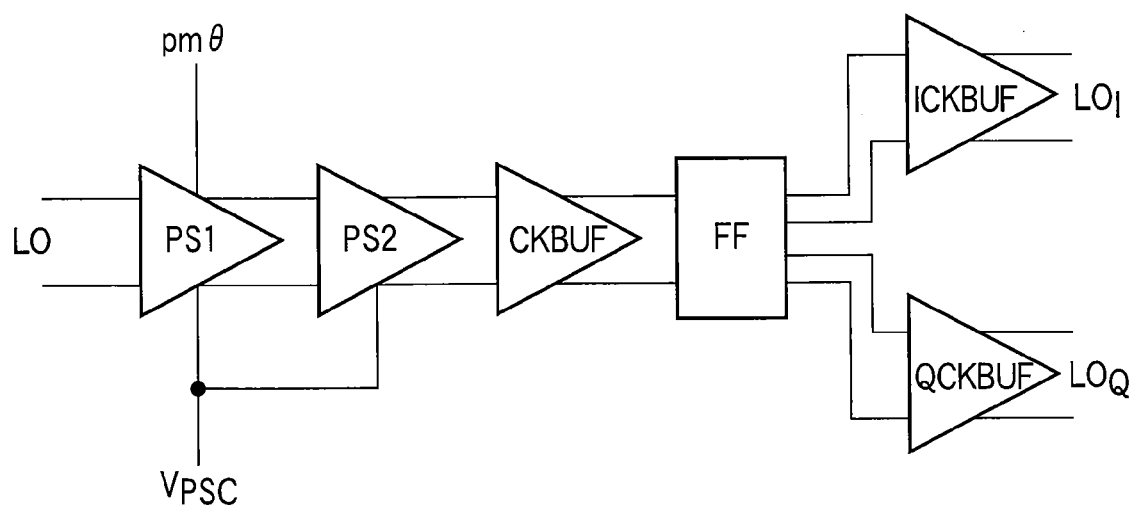
FIG. 16 is a circuit diagram showing a local signal supply path for a quadrature demodulator.

As shown in FIGS. 1 and 13, a local signal from the local oscillator 20 is supplied to the mixers 31 and 32 of the quadrature demodulator 30 via the variable phase shifter 29 and 90° phase shifter 33. FIG. 16 shows the local signal supply path for the quadrature demodulator 30, and shows parts corresponding to the variable phase shifter 29 and 90° phase shifter 33 in detail.

In FIG. 16, local signals LO from the local oscillator 20 are input to cascaded phase shifters PS1 and PS2. Phase shift amounts of the phase shifters PS1 and PS2 change according to a phase control signal VPSC. The relationship between the phase control signal VPSC and the phase control signal Vθ shown in FIG. 1 will be described later. The local signals output from the phase shifters PS1 and PS2 are input to a flip-flop FF via a buffer circuit CKBUF.

The flip-flop FF frequency-divides each input local signal into two, thus generating two local signals having a 90° phase difference. The two local signals output from the flip-flop FF are supplied to the mixers 31 and 32 in the quadrature demodulator 30 via an I local buffer ICKBUF and Q local buffer QCKBUF, respectively. At the output of the flip-flop FF, since the frequency of the LO signal is halved, the local oscillator 20 is required to generate a local signal of a frequency twice that of the local signal required in the quadrature demodulator 30. On the other hand, for example, an RC-CR 90° phase shifter using a differentiator and integrator may be used in place of the flip-flop FF. In this case, the input and output local signals of the 90° phase shifter can have the same frequency.

To the phase shifters PS1 and PS2, a polarity switching signal Pmθ is input. By this signal Pmθ, the polarity of the input local signal, that is, the phase can be changed through 180°. As described above, assuming that the flip-flop FF which performs 2-frequency division is used as the 90° phase shifter after the phase shifters PS1 and PS2, the phases of the local signals supplied to the mixers 31 and 32 can be changed through 90° by a 180° phase change of the local signal by the signal Pmθ. Such phase adjustment of the local signals based on Pmθ is effective, for example, when the variable ranges of the phase shifters PS1 and PS2 are decreased due to process errors.

(First Practical Example of Phase Shifter)

FIG. 17 shows a practical circuit example of the phase shifters PS1 and PS2 in FIG. 16. The phase shifter shown in FIG. 17 has MOSFETs M1 to M6, and capacitors C1 to C4.

The phase shifter phase-shifts differential signals input to input terminals +VIN and −VIN, and outputs them from output terminals +VOUT and −VOUT. C1, M3, C2, C3, M4, and C4 form a phase shift circuit. A differential pair of M1 and M2, to a common source terminal of which a current source I1 is connected, and an in-phase level setting circuit including M5, M6, R1, and R2 connected to the drain terminals of M1 and M2 form a driving circuit for the phase shift circuit.

The MOSFETs M3 and M4 operate as variable resistors whose resistances change depending on the phase control signal VPSC. In the variable resistor, in order to use a linear region of the MOSFET as in the attenuator, a drain-source voltage VDS, gate-source voltage VGS, and threshold voltage Vth are set to satisfy a relation VDS<VGS−Vth in M3 and M4. In order to broaden the control range by the phase control signal VPSC, it is desired that the potentials of the drain terminal of the MOSFET M4 and the source terminal of M3 are set around a power supply potential or GND potential. For this purpose, a DC potential of the drain terminal of M4 is blocked by the capacitor C3, and that of the source terminal of M3 is blocked by the capacitor C2.

On the other hand, the capacitor C4 forms a CR circuit together with a resistor defined by the MOSFET M4, and the capacitor C1 forms a CR circuit together with the MOSFET M3. These two CR circuits form a CR bridge circuit. Therefore, when the resistances of M4 and M3 change according to the phase control signal VPSC, the phases of the local signals change.

In order to explain the operation of this phase shifter, how the output phases change depending on the cases of the large and small resistances of the MOSFETs M3 and M4 will be described below. When the resistances of M3 and M4 are large, that is, when VPSC is around Vth, a signal of the drain of M2 is transferred to the terminal +VOUT via C4 due to the large resistance of M4. Also, due to the large resistance of M3, a signal of the drain of M1 is transferred to the terminal −VOUT.

On the other hand, when the resistances of M3 and M4 are small, that is, when VPSC is around VDD, a signal of the drain of M1 is transferred to the terminal +VOUT via C3 due to the small resistance of M4. Also, due to the small resistance of M3, a signal of the drain of M2 is transferred to the terminal −VOUT via C2. In this manner, by variably setting the resistances of M3 and M4, the phases of output signals from the terminals +VOUT and −VOUT change through 180° at maximum.

Letting C be values of the capacitors C1 and C4 and RON be the resistances (ON resistances) of the MOSFETs M3 and M4, the phase shift characteristics of the CR bridge circuit are expressed by:

$$\theta = 2\tan^{-1}(1/\omega C R_{ON}) \quad (8)$$

where θ represents a phase difference between a voltage between the drain terminals of M2 and M1, and a voltage between the output terminals +VOUT and −VOUT. Since M3 and M4 operate in a linear region, letting A be a proportional constant, they can be approximated by $R_{ON}=A/(V_{PSC}-Vth)$, as described using FIG. 16. Therefore, equation (8) can be modified as follows.

$$\theta = 2\tan^{-1}\{(V_{PSC}-V_{th})/A\omega C\} \quad (9)$$

When $V_{PCS}$ is smaller than Vth, since the MOSFET is perfectly set in an OFF state, the phase θ can no longer be controlled by $V_{PCS}$. In order to avoid this, the threshold compensation circuit shown in FIG. 15 can be applied as in the attenuator ATT shown in FIG. 14. That is, when the control currents Icnt1 and Icnt2 become larger than 0, the output of OP1, that is, the gate potential of M1 is automatically set in M1 to be a value larger than Vth so as to flow a current. Note that the amplitude control signal and phase control signal are specified by a voltage and current in this case. However, these signals can be converted according to an equation V=IR. For example, the control currents Icnt1 and Icnt2 are equivalent to the phase control signal Vθ in this case.

(Second Practical Example of Phase Shifter)

FIG. 18 is a circuit diagram of a phase shifter in which the polarity inverting function included in the phase shifter PS1 in FIG. 16 is added to the phase shifter shown in FIG. 17. In the phase shifter shown in FIG. 18, a second differential pair of MOSFETs M7 and M8 are added in addition to the first differential pair of the MOSFETs M1 and M2 shown in FIG. 17. A tail current supplied from the current source I1 to the first differential pair is switched by the polarity switching signal pmθ, and a tail current supplied from a current source I2 to the second differential pair is switched by an inverted polarity switching signal pmθ/.

Whether to operate the first differential pair of M1 and M2 or the second differential pair of M7 and M8 is decided by the polarity switching signals pmθ and pmθ/. As shown in FIG. 18, the gate terminals of M1 and M7 are commonly connected to +VIN, and the gate terminals of M2 and M8 are commonly connected to −VIN, but the drain terminals as outputs of M1 and M8, and those of M2 and M7 are commonly connected. That is, the first and second differential pairs have inverted connection relationships of the drain terminals as outputs. Therefore, by selectively operating the first and second differential pairs by the polarity switching signals pmθ and pmθ/, the polarity of the output signals of the phase shifter can be inverted.

(Amplitude/Phase Detection Circuit)

A practical example of the amplitude difference detector 35 and phase comparator 36 shown in FIGS. 1 and 13 will be described below. When the amplitude difference detector 35 and phase comparator 36 are implemented by an analog circuit, for example, an amplitude/phase detection circuit shown in FIG. 19 can be used. FIG. 19 shows a circuit which receives amplitude or phase detection target inputs A, B, C, and D and obtains a detection output OUT.

The amplitude difference detection is executed according to, for example, equation (1), as described above. $(FI^2+FQ^2)$ in equation (1) expresses an output OUT (to be referred to as OUT1 hereinafter) when FI is input to the inputs A and C and FQ is input to B and D. Likewise, $(I^2+Q^2)$ in equation (1) expresses an output OUT (to be referred to as OUT2 hereinafter) when I is input to the inputs A and C and Q is input to B and D. By detecting a difference corresponding to OUT1−OUT2, the amplitude difference detection signal $V^DA$ according to equation (1) can be obtained by an analog circuit.

FIG. 20 shows an example of a difference detection circuit for detecting the difference OUT1−OUT2. OUT1 is given as an input IN1, and OUT2 is given as an input IN2. The difference detection circuit shown in FIG. 20 has a first differential amplifier including a differential pair of MOSFETs M3 and M4 and a common current source I1, a second differential amplifier including a differential pair of MOSFETs M5 and M6 and a common current source I2, and a load circuit which is arranged common to the first and second differential amplifiers, and includes MOSFETs M1 and M2 and resistors R1 and R2. The input to the first differential amplifier is IN1, and that to the second differential amplifier is IN2.

The outputs of the first and second differential amplifiers are connected to the common load circuit by inverting their polarities. The difference detection circuit shown in FIG. 20 obtains, as the output OUT, a signal corresponding to IN1−IN2, that is, OUT1−OUT2. Therefore, by combining the circuit shown in FIG. 20 with the circuit shown in FIG. 19, the amplitude difference detector 35 can be implemented.

Since the phase difference detection signal PHS and sign detection signal PL are calculated using, for example, equations (4) and (5), as described above, they can be implemented by the circuit shown in FIG. 19. That is, when I, FI, Q, and FQ are respectively input to the inputs A, C, B, and D, the calculation given by equation (4) can be implemented. Also, when I, FQ, Q, and FI are respectively input to the inputs A, C, B, and D, the calculation given by equation (5) can be implemented.

In order to calculate the required amplitude control signal VA and phase control signal Vθ by applying feedback control using an analog circuit, the feedback control can be applied using non-converted voltage signals, but it may be applied after voltage signals are converted into currents. When the feedback control is applied after voltage signals are converted into current signals, it is desired to use the threshold fluctuation compensation circuit shown in FIG. 15.

(Polarity Inversion Switch and Baseband Amplifier)

Figure 21:
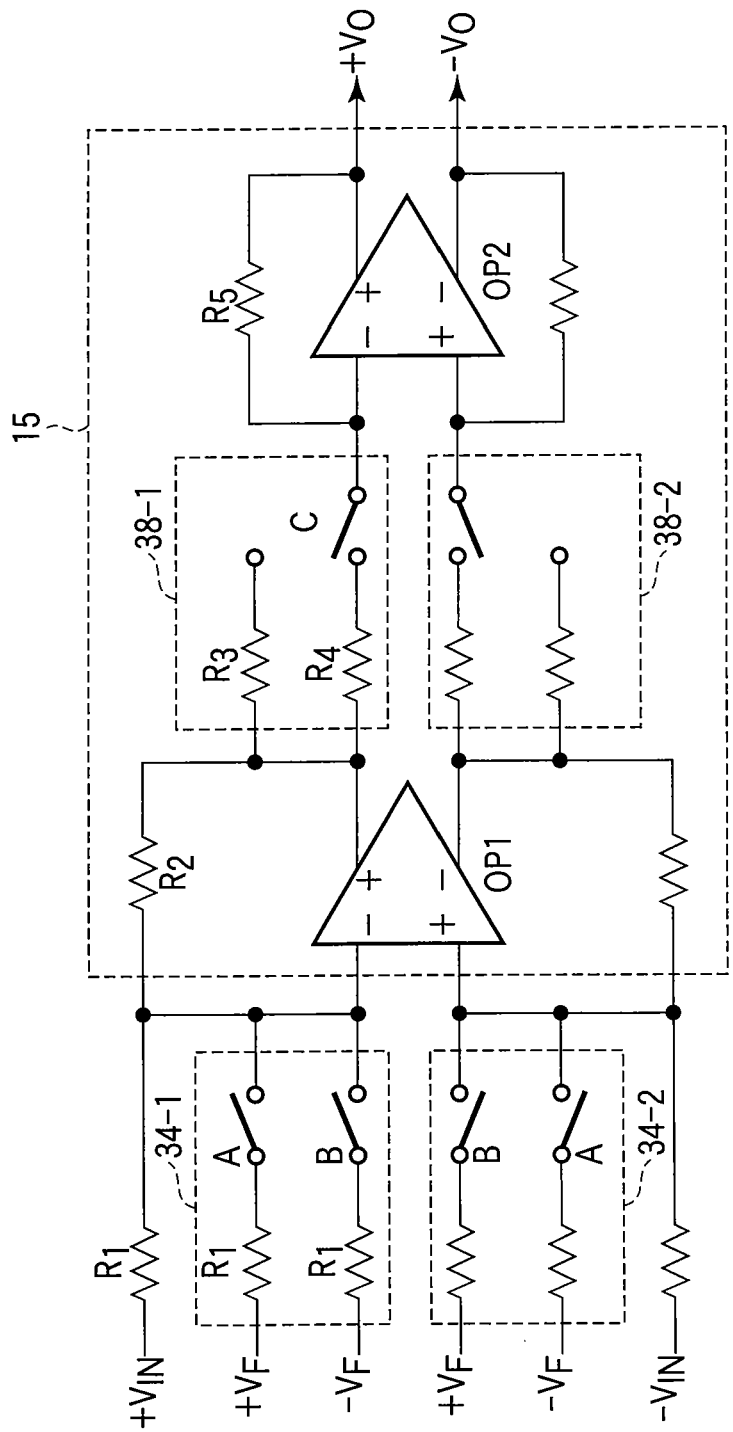
FIG. 21 is a circuit diagram showing a practical example of a polarity inversion switch and baseband amplifier.

FIG. 21 shows a practical circuit example of the switch 34 and baseband amplifier 15 shown in FIGS. 1 and 13. FIG. 21 shows the switch 34 while dividing it into two blocks 34-1 and 34-2. In this case, VIN represents the input I/Q signals I and Q, and a feedback signal VF corresponds to the feedback I/Q signals FI and FQ. When one of switches A and B is turned on, and the other switch is turned off, the feedback I/Q signals (VF) are fetched while their polarities are changed. On the other hand, since the polarities of the input I/Q signals VIN need not be changed, these signals are fetched intact. A gain is given by −R2/R1.

The baseband amplifier 15 is configured to have a gain in the calibration mode when the Cartesian loop is open, which is different from that when the Cartesian loop is closed. The baseband amplifier 15 has two cascaded operational amplifiers OP1 and OP2, and gain switching circuits 38-1 and 38-2 inserted between OP1 and OP2. The gain of the second operational amplifier OP2 including feedback resistors is expressed by −R5/R3 or −R5/R4. Each of the gain switching circuits 38-1 and 38-2 can switch a gain in two stages by switching two resistors R3 and R4 by a switch C in this example.

For example, a case will be examined below wherein R3=10×R4=R5, R3 is selected in the calibration mode, and R4 is selected in the transmission mode. In the calibration mode, the baseband amplifier 15 serves as an amplifier of a gain −R5/R3=−1. A feedback V−ATT is set to set a loop gain=1 in this state. When the control shifts from the calibration mode to the transmission mode, since the resistor R3 is switched to R4, a gain is −R5/R4=−10, and is increased by 20 dB compared to the calibration mode. That is, in the transmission mode, since the loop gain is 20 dB, the linearity can be enhanced.

In the gain switching circuits 38-1 and 38-2 in FIG. 21, since the resistors R3 and R4 are selected by the switch C, a transient response is generated upon switching the gain. When a transient response time is limited due to the wireless specifications, it is desired to change the gains not steeply but continuously.

In the baseband amplifier 15 shown in FIG. 22, the gain switching circuits 38-1 and 38-2 in FIG. 21 are replaced by a variable resistance circuit 39 including MOSFETs M1 and M2. A gain control voltage VCNT corresponding to a gain setting signal from the controller 40 is supplied to the gate terminals of M1 and M2. When the resistances of the MOS- FETs M1 and M2 change according to the gain control voltage VCNT, the gain of the baseband amplifier 15 changes continuously. In the calibration mode, the resistances of M1 and M2 are set to have the same value as R5. Upon transition from the calibration mode to the transmission mode, the gain control voltage VCNT is set to slowly transit the resistances of M1 and M2 from R5 to about R5/10. In this way, since a steep gain change of the baseband amplifier 15 can be avoided, a gain convergence time to a predetermined value is shortened in some cases.

(I/Q Imbalance Compensation)

When the quadrature modulator and quadrature demodulator are implemented by an analog circuit, an amplitude error or phase error between an I component (in-phase component) and Q component (quadrature component) is caused by the incompleteness of the analog circuit. Such amplitude or phase error between I and Q components is generally called an I/Q imbalance. The Cartesian loop can be applied to compensation for an I/Q imbalance as follows.

The embodiments described so far have exemplified the case in which a distortion caused in the transmitting unit is compensated for using the linearity of the feedback circuit of the Cartesian loop. Likewise, if an I/Q imbalance of the quadrature demodulator 30 in the feedback circuit is small, that of the quadrature modulator 16 in the transmitting system can be compensated for using the Cartesian loop.

More specifically, a conventional I/Q imbalance compensation technique of a quadrature demodulator used in a wireless reception apparatus is applied to the quadrature demodulator 30 in the Cartesian loop. In order to compensate for an amplitude error of the I/Q imbalance, the value of the resistor R1 which inputs the feedback signal VF in FIG. 21 can be adjusted as needed. When an I/Q imbalance caused by a phase shift error of the 90° phase shifter 33 for local signals occurs, the phase difference between two local signals output from the 90° phase shifter 33 is adjusted to be 90°. This phase difference adjustment may be done using, for example, the phase shifter in FIG. 17. In this way, by applying the I/Q imbalance compensation to the quadrature demodulator 30 in the feedback circuit of the Cartesian loop, an error in the transmitting unit system can be corrected by the Cartesian loop.

Note that in the aforementioned example of the amplitude normalizer 2302, the phase difference detection signal PHS is normalized by dividing it by a square of the magnitude of a vector due to I and Q of the input I/Q signals. Alternatively, the phase difference detection signal PHS may be normalized by dividing it by a square of the magnitude of a vector due to FI and FQ of the feedback I/Q signals.

(First Example of Phase Comparator 36)

Figure 23:
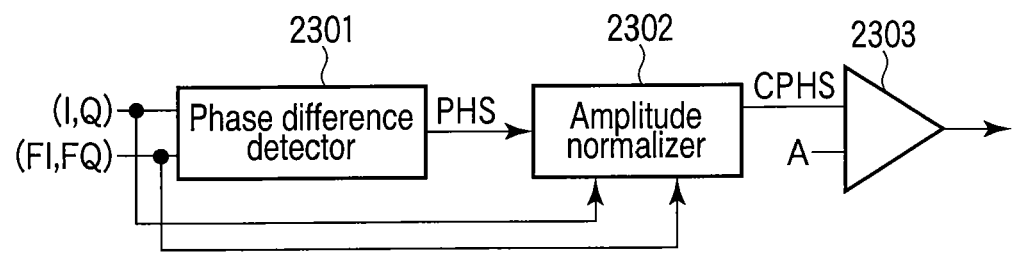
FIG. 23 is a block diagram showing details of some components of a phase comparator.

The first example of the phase comparator 36 will be described in detail below. The phase comparator 36 outputs the composite phase difference detection signal $V^D\theta$. As described above, the composite phase difference detection signal $V^D\theta$ includes the normalized phase difference signal CPHS and sign detection signal PL. FIG. 23 shows a part for generating the normalized phase difference signal CPHS of the phase comparator 36.

In FIG. 23, a phase difference detector 2301 detects a phase difference θ between the input I/Q signals I and Q and the feedback I/Q signals FI and FQ according to equation (4), and generates the phase difference detection signal PHS. The phase difference detector 2301 is implemented by, for example, the amplitude/phase detection circuit shown in FIG. 19.

The phase difference detection signal PHS is input to an amplitude normalizer 2302. In order to calculate a state of the phase difference θ=0 in the phase comparator 36, the phase difference detection signal PHS given by equation (4) is input to a limiter shown in FIG. 24 to determine whether PHS is positive or negative. This is because even when signals used in the calibration are waves to be modulated such as the input I/Q signals, the term of $I^2+Q^2$ surely becomes positive. However, when the phase difference detection signal PHS is directly input to the limiter, if PHS includes an offset voltage, the value θ to be detected fluctuates according to amplitude fluctuations of the input I/Q signals I and Q. Letting $V_{OFF}$ be an offset voltage, the value of the phase difference θ detected by the phase difference detector 2301 is given by:

$$\theta=\sin^{-1}(V_{OFF}/(I^2+Q^2)) \quad (10)$$

As can be understood from equation (10), the detection precision drops when the phase difference θ is detected while $I^2+Q^2$ is small. In order to avoid this, the phase difference signal PHS is input to the amplitude normalizer 2302, as shown in FIG. 23, to normalize it by the amplitudes of the input I/Q signals I and Q, thereby generating the normalized phase difference signal CPHS. The normalized phase difference signal CPHS is input to a limiter 2303.

The phase is adjusted after the normalization by the amplitude. When the phase difference detection signal PHS is normalized by the amplitudes of the input I/Q signals I and Q, from equation (6), the phase difference θ to be detected is given by:

$$\theta=\sin^{-1}(A_1 V_{OFF}) \quad (11)$$

Therefore, a detection error of the phase difference θ due to the amplitude fluctuations can be eliminated, but a detection error is caused by the offset voltage $V_{OFF}$, as given by equation (11). Hence, the offset voltage $V_{OFF}$ is canceled to be equivalently zero using the limiter 2303 shown in FIG. 24. If a reference potential A of the limiter 2303 is set to be, for example, $A=V_{OFF}$, the offset $V_{OFF}$ becomes equivalently zero.

A practical example of the amplitude normalizer 2302 in FIG. 23 will be described below. FIG. 25 is a circuit diagram showing a practical example of the amplitude normalizer 2302. The phase difference detection signal PHS is expressed by differential current signals $I_1+bI_M \sin\theta$ and $I_1-bI_M \sin\theta$ (where $I_M=I^2+Q^2=FI^2+FQ^2$, $I_1$ is a DC current, and b is a constant). On the other hand, the amplitude difference detection signal $V^D A$ is expressed by differential current signals $I_2+(½)aI_M$ and $I_2-(½)aI_M$ (where $I_2$ is a DC current, and a is a constant).

The differential current signals $I_2+(½)aI_M$ and $I_2-(½)aI_M$ as the amplitude difference detection signal $V^D A$ are received by a first current mirror including MOSFETs: M1 to M4 and a second current mirror including MOSFETs: M5 and M6, and a current signal $aI_M$ flows through a common source terminal of a first differential pair of MOSFETs: M7 and M8.

On the other hand, the differential current signals $I_1+bI_M \sin\theta$ and $I_1-bI_M \sin\theta$ as the phase difference detection signal PHS are received by a third current mirror including MOSFETs: M14 and M13 and a fourth current mirror including MOSFETs: M16 and M15, and are respectively input to a common source terminal of a second differential pair of MOSFETs: M9 and M10 and that of a third differential pair of MOSFETs: M11 and M12. When the MOSFETs: M7 to M12 are operated in a weak inversion region, they satisfy:

$$Io/aI_M = I+/(I_1+bI_M \sin\theta) = I-/(I_1-bI_M \sin\theta) \quad (12)$$

A difference between I+ and I− as output signals of the amplitude normalizer 2302 in FIG. 25 is given by:

$$I+ - I- = Io/a \times 2b \sin\theta \quad (13)$$

Figure 24:
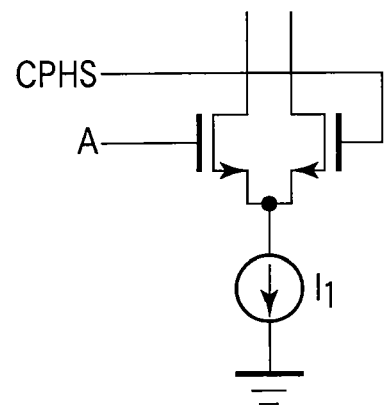
FIG. 24 is a circuit diagram showing a limiter in FIG. 23.

Thus, a signal free from the influence of an $I_M$ component is obtained. Since the output signals of the amplitude normalizer 2302 shown in FIG. 25 are current signals, they are converted into voltage signals by a current-voltage converter such as a resistor (not shown), and are then input to the limiter 2303. Since the limiter shown in FIG. 24 is a circuit which receives a single-ended input signal, the differential current signals can be converted into a single-ended voltage signal in this case.

When the method of generating the amplitude control signal and phase control signal by the analog feedback control shown in FIG. 13 is used, since the phase difference detection signal given by equation (4) is a function of a phase and amplitude, if the amplitude fluctuates, the control cannot be normally applied. For this reason, the amplitude normalizer 2302 is connected after the phase difference detector 2301, as shown in FIG. 23, and its result is input to the phase shifter 29. In this case, the output from the amplitude normalizer 2302 is, for example, the phase control signal Vθ. When an amplifier is used to increase the loop gain, an output signal of that amplifier is Vθ.

(Second Example of Phase Comparator 36)

Figure 26:
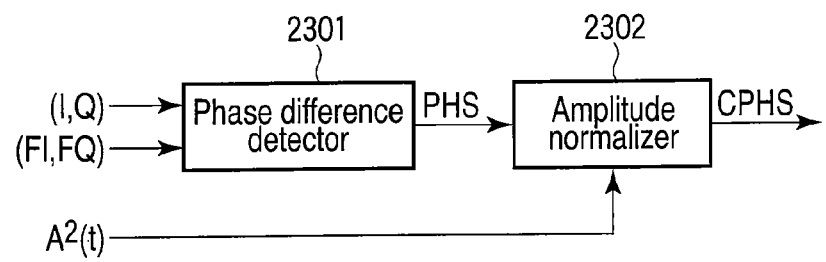
FIG. 26 is another block diagram showing details of some components of the phase comparator.

The second example of the phase comparator 36 will be described in detail below. FIG. 26 shows a part for generating the normalized phase difference signal CPHS of the phase comparator 36. As in the case of FIG. 23, in FIG. 26, the phase difference detector 2301 detects the phase difference θ between the input I/Q signals I and Q and the feedback I/Q signals FI and FQ according to equation (4), and generates the phase difference detection signal PHS.

When the method of generating the amplitude control signal and phase control signal by the analog feedback control shown in FIG. 13 is used, since the phase difference detection signal PHS given by equation (4) is a function of a phase and amplitude, the control cannot be normally applied. Hence, the amplitude normalizer 2302 is connected after the phase difference detector 2301, as shown in FIG. 26, and the normalized phase difference signal CPHS obtained by normalizing the amplitude of the phase difference detection signal PHS by the amplitude normalizer 2302 is input to the phase shifter 29.

In order to normalize the phase difference detection signal PHS by the amplitude, as can be seen from equation (4), the phase difference detection signal PHS can be divided by a value of expression (14) below (in other words, the phase difference detection signal PHS can be multiplied by an inverse of expression (14)).

$$FI^2(t)+FQ^2(t) \quad (14)$$

Expression (14) represents the magnitude of the vector of the feedback I/Q signals FI and FQ. In this case, the example of normalizing the phase difference detection signal PHS by dividing it by the a square of the magnitude of the vector of the feedback I/Q signals has been described. Alternatively, the phase difference detection signal PHS may be normalized by dividing it by the square of the magnitude of the vector of the input I/Q signals I and Q. The square of the magnitude of the vector of the feedback I/Q signals FI and FQ or those of the magnitude of the vector of the input I/Q signals I and Q will be referred to as an I/Q signal amplitude hereinafter, and will be expressed by $A^2(t)$.

However, with this amplitude normalization method, when the I/Q signal amplitude expressed by expression (14) is approximate to 0, the phase difference detection signal PHS has to be amplified by an amplification factor approximate to infinity by an analog multiplier.

The further improved arrangements of the amplitude normalizer 2302 will be described below using FIGS. 27, 28, 29, 30, and 31. FIGS. 27, 28, 29, 30, and 31 show various examples of the amplitude normalizer 2302 together with waveform examples of input and output signals and intermediate processing signals.

(First Example of Amplitude Normalizer 52)

Figure 27:
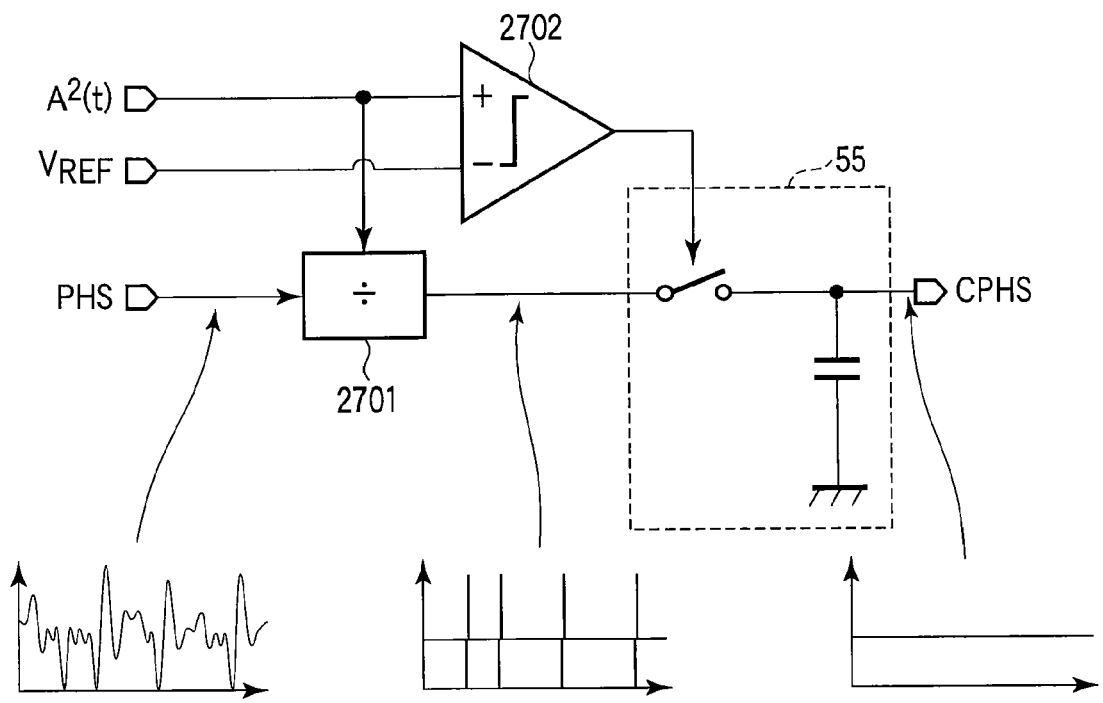
FIG. 27 is a block diagram showing the first example of the amplitude normalizer in FIG. 26.

The amplitude normalizer 2302 shown in FIG. 27 is configured by a divider 2701, comparator 2702, and sample-hold circuit 55, and the divider 2701 and sample-hold circuit 55 generate the normalized phase difference signal CPHS from the phase difference detection signal PHS in accordance with a comparison result signal from the comparator 2702.

The divider 2701 can normalize the amplitude of the phase difference detection signal PHS in a region equal to or lower than a certain gain, but it can only amplify up to a finite gain. For this reason, when the value of the I/Q signal amplitude $A^2(t)$ expressed by expression (14) is around 0, the value of the output signal of the divider 2701 diverges, as shown in FIG. 27. Therefore, the normalization cannot be normally executed by only the divider 2701. Hence, in the example of FIG. 27, the output signal of the divider 2701 is sampled and held by the sample-hold circuit 55 as follows.

The sample-hold circuit 55 is controlled by the comparator 2702. The comparator 2702 has a reference value input terminal and I/Q signal amplitude input terminal. When the I/Q signal amplitude $A^2(t)$ is larger than a reference value (reference voltage) $V_{REF}$, the comparator 2702 outputs HIGH as a comparison result signal; otherwise, it outputs LOW as the comparison result signal.

During the HIGH period of the comparison result signal from the comparator 2702, the sample-hold circuit 55 outputs a division signal output from the divider 2701, that is, a division signal corresponding to the current value of the phase difference detection signal PHS as the normalized phase difference signal CPHS intact. In this manner, during the HIGH period of the comparison result signal from the comparator 2702, the sample-hold circuit 55 skips the sample-hold operation, and tracks the division signal output from the divider 2701 to output the normalized phase difference signal CPHS.

When the comparison result signal from the comparator 2702 goes LOW, the sample-hold circuit 55 executes a sample-hold operation. That is, the sample-hold circuit 55 samples the division signal from the divider 2701 at a timing immediately before the comparison result signal goes LOW, holds it during the subsequent LOW period, and keeps outputting the sampled and held division signal as the normalized phase difference signal CPHS. In this case, the reference value $V_{REF}$ is set to be, for example, a value equal to or larger than the I/Q signal amplitude, which value allows the divider 2701 to normally execute the normalization.

With this arrangement, the amplitude normalizer 2601 can be implemented by a practical analog circuit.

The divider 2701 in FIG. 27 is configured, as shown in, for example, FIG. 25, as in the amplitude normalizer 2302 in the phase comparator 36 in the first example. The difference between I+ and I− as the output signals of the divider 2701 in FIG. 25 is expressed by equation (12). Since the output signals of the divider 2701 in FIG. 25 are current signals, they are converted into voltage signals by a current-voltage converter such as a resistor (not shown), and are then input to the sample-hold circuit 55.

(Second Example of Amplitude Normalizer 52)

The amplitude normalizer 2302 in FIG. 28 is different from that in FIG. 27 in that the divider 2701 is not used, and the phase difference detection signal PHS is directly input to the sample-hold circuit 55. In the amplitude normalizer 2302 in FIG. 28, only when the I/Q signal amplitude $A^2(t)$ is larger than the reference value $V_{REF}$, the phase difference detection signal PHS is output intact as the normalized phase difference signal CPHS, thus normalizing the amplitude. In this way, with a simple arrangement that does not require any divider by an analog amplifier, the amplitude of the phase difference detection signal PHS can be normalized.

(Third Example of Amplitude Normalizer 52)

Figure 29:
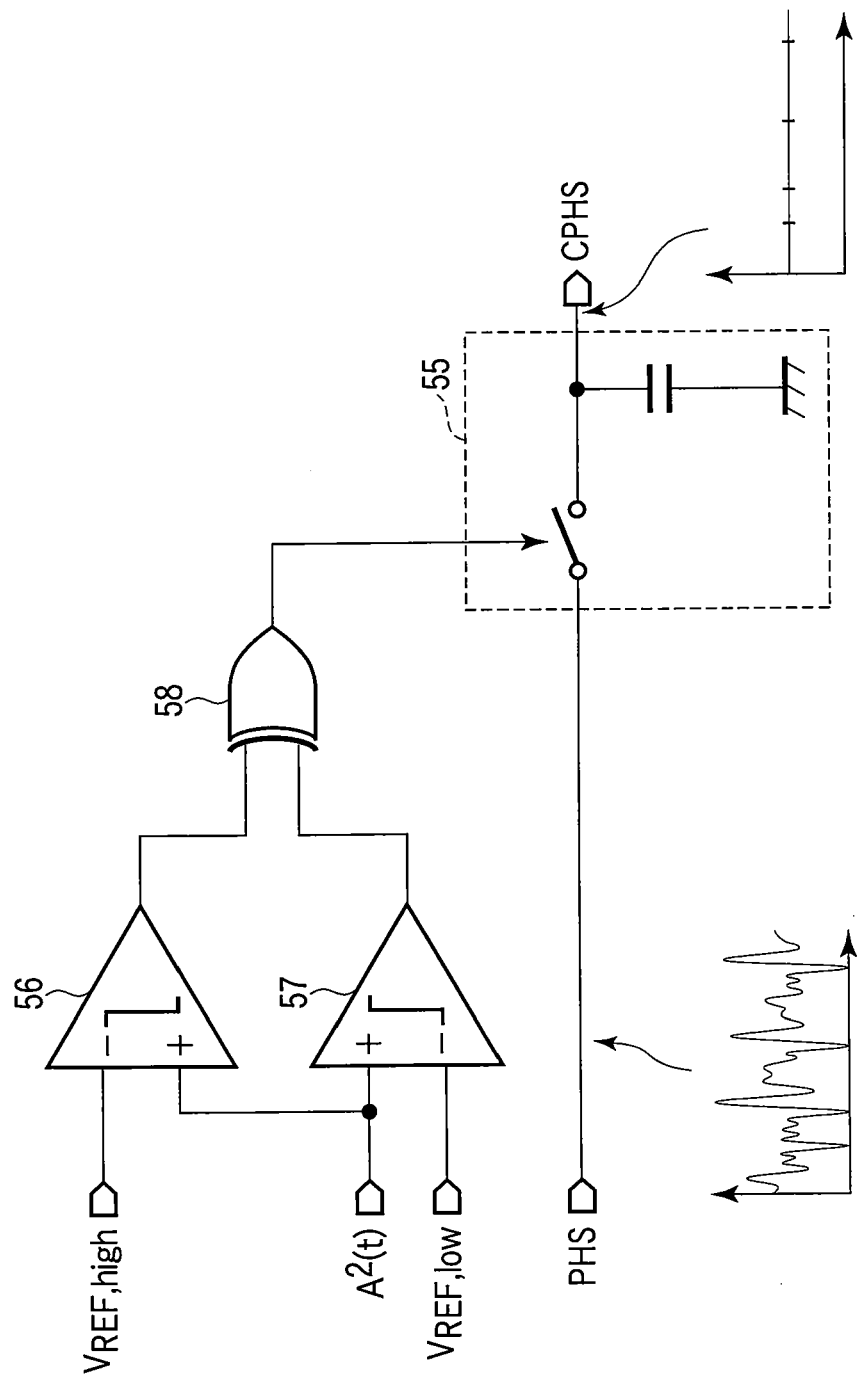
FIG. 29 is a block diagram showing the third example of the amplitude normalizer in FIG. 26.

In the amplitude normalizer 2302 in FIG. 29, the I/Q signal amplitude $A^2(t)$ is input to two comparators 56 and 57, and is compared with two reference values $V_{REF,low}$ and $V_{REF,high}$. Comparison result signals from the comparators 56 and 57 are input to an exclusive OR circuit 58. An output signal of the exclusive OR circuit 58 outputs HIGH when the I/Q signal amplitude $A^2(t)$ falls within a range between the two reference values $V_{REF,low}$ and $V_{REF,high}$. Otherwise, the exclusive OR circuit 58 outputs LOW. Assume that the two reference values satisfy a relation $V_{REF,low} < V_{REF,high}$. The sample-hold circuit 55 is controlled by the output signal of the exclusive OR circuit 58.

That is, according to the comparison result signals input from the comparators 56 and 57 via the exclusive OR circuit 58, (a) when the I/Q signal amplitude $A^2(t)$ is larger than the reference value $V_{REF,low}$ and is smaller than the reference value $V_{REF,high}$, the amplitude normalizer 2302 in FIG. 29 outputs the current value of the phase difference detection signal PHS as the normalized phase difference signal CPHS. (b) When the I/Q signal amplitude $A^2(t)$ is smaller than the reference value $V_{REF,low}$ or is larger than the reference value $V_{REF,high}$, the amplitude normalizer 2302 outputs, as the normalized phase difference signal CPHS, the value of the phase difference detection signal PHS, which is sampled and held by the sample-hold circuit 55 immediately before the I/Q signal amplitude $A^2(t)$ becomes smaller than the reference value $V_{REF,low}$ or becomes larger than the reference value $V_{REF,high}$.

As described above, according to the amplitude normalizer 2302 shown in FIG. 29, a signal whose amplitude is equivalently normalized can be generated without using any divider by an analog amplifier.

(Fourth Example of Amplitude Normalizer 52)

In the amplitude normalizer 2302 in FIG. 30, a low-pass filter 60 having a variable resistor 61 and capacitor 62 normalizes the amplitude of the phase difference detection signal PHS, and generates the normalized phase difference signal CPHS. The variable resistor 61 is implemented by, for example, an NMOSFET. In this case, a gate terminal of the NMOSFET is used as a control terminal of the variable resistor 61. To the control terminal of the variable resistor 61, the I/Q signal amplitude $A^2(t)$ is supplied as a control voltage. The resistance of the variable resistor 61 decreases monotonically with respect to the control voltage. More specifically, the resistance of the variable resistor 61 becomes low when the I/Q signal amplitude $A^2(t)$ is large, and it becomes high when the I/Q signal amplitude $A^2(t)$ is small.

The phase difference detection signal PHS is input to the low-pass filter 60. At this time, since the resistance of the variable resistor 61 is controlled by the I/Q signal amplitude $A^2(t)$, as described above, a cutoff frequency of the low-pass filter 60 becomes high when the I/Q signal amplitude $A^2(t)$ is large, and it becomes low when the I/Q signal amplitude $A^2(t)$ is small. Therefore, when the I/Q signal amplitude $A^2(t)$ is large, the attenuation amount of the phase difference detection signal PHS decreases; when the I/Q signal amplitude $A^2(t)$ is small, the attenuation amount of the phase difference detection signal PHS increases.

As described above, according to the fourth example of the amplitude normalizer 2302, as in the second example, only when the I/Q signal amplitude $A^2(t)$ is large can the phase difference detection signal PHS be output, thereby normalizing the amplitude of the phase difference detection signal PHS.

Note that the amplitude normalizer 2302 of the fourth example shown in FIG. 30 can also be used as a loop filter of the phase calibration loop.

(Fifth Example of Amplitude Normalizer 52)

FIG. 31 shows the fifth example of the amplitude normalizer 2302. In FIG. 31, the low-pass filter 60 includes two variable resistors 61A and 61B. The variable resistor 61A is implemented by, for example, an NMOSFET as in the variable resistor 61 in FIG. 30, and the variable resistor 61B is implemented by, for example, a PMOSFET. In this case, the NMOSFET and PMOSFET are respectively used as the variable resistors 61A and 61B for the sake of easy understanding, but they are merely examples, and variable resistors of other arrangements may be used.

The resistance of the variable resistor 61A monotonically decreases with increasing I/Q signal amplitude $A^2(t)$, as in the variable resistor 61 in FIG. 30. That is, the resistance of the variable resistor 61A becomes low when the I/Q signal amplitude $A^2(t)$ is large, and it becomes high when the I/Q signal amplitude $A^2(t)$ is small. On the other hand, the resistance of the variable resistor 61B monotonically increases with increasing I/Q signal amplitude $A^2(t)$, conversely. That is, the resistance of the variable resistor 61B becomes high when the I/Q signal amplitude $A^2(t)$ is large, and it becomes low when the I/Q signal amplitude $A^2(t)$ is small.

In a composite variable resistor in which such variable resistors 61A and 61B are connected in series, the resistance becomes high when the I/Q signal amplitude $A^2(t)$ is small and large, and it becomes low when the I/Q signal amplitude $A^2(t)$ is middle, i.e., as the I/Q signal amplitude $A^2(t)$ approaches the reference value. Since the composite variable resistor performs the above operation, the cutoff frequency of the low-pass filter 60 in FIG. 31 becomes low when the I/Q signal amplitude $A^2(t)$ is small and large, and the cutoff frequency becomes high when the I/Q signal amplitude $A^2(t)$ is middle. That is, when the I/Q signal amplitude $A^2(t)$ is small and large, the attenuation amount of the phase difference detection signal PHS increases, and when the I/Q signal amplitude $A^2(t)$ is middle, the attenuation amount of the phase difference detection signal PHS decreases to normalize the amplitude of the phase difference detection signal PHS, thus generating the normalized phase difference signal CPHS.

As described above, according to the fifth example of the amplitude normalizer 2302, as in the third example, the phase difference detection signal PHS can be equivalently normalized. Note that the amplitude normalizer 2302 of the fifth example can be used as a loop filter of the phase calibration loop.

In the aforementioned embodiments, as shown in FIG. 1, the quadrature modulator 16 and quadrature demodulator 30 commonly use the local oscillator 20. However, the local oscillator 20 need not always be commonly used, and two local oscillators (not shown) may be used.

The resistor R is arranged to prevent a signal from being radiated from the antenna 25 when the Cartesian loop is closed. Therefore, the antenna switch 26 and resistor R may be omitted as the case may be (for example, when a signal may be allowed to be radiated from the antenna 25).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A wireless transmission apparatus using a Cartesian loop, comprising:
   adder units configured to generate synthesized I/Q signals by synthesizing input I/Q signals to be transmitted, and feedback I/Q signals;
   a quadrature modulator unit configured to generate a quadrature modulated signal;
   a power amplifier unit configured to amplify the quadrature modulated signal and output a transmission RF signal;
   a quadrature demodulator unit configured to generate the feedback I/Q signals by applying quadrature demodulation using a local signal to a feedback RF signal branched from the transmission RF signal;
   a switch unit configured to be used to set ON/OFF of an input of the feedback I/Q signals to the adder units;
   an amplitude difference detector unit configured to generate an amplitude difference detection signal by detecting an amplitude difference between the input I/Q signals and the feedback I/Q signals during an OFF period of the switch unit;
   a phase difference detector unit configured to generate a phase difference detection signal by detecting a phase difference between the input I/Q signals and the feedback I/Q signals during the OFF period of the switch unit;
   a normalizer unit configured to generate a normalized phase difference signal by normalizing the phase difference detection signal by a signal amplitude of one of the input I/Q signals and the feedback I/Q signals;
   a power setting unit configured to set a power of the transmission RF signal;
   a control signal generator unit configured to receive the amplitude difference detection signal and the normalized phase difference signal, and generate an amplitude control signal that minimizes the amplitude difference and a phase control signal that minimizes the phase difference in a state in which the power is set during the OFF period of the switch unit;
   a memory unit configured to store the amplitude control signal and the phase control signal;
   an amplitude adjuster unit configured to adjust an amplitude of the feedback RF signal according to the amplitude control signal stored in the memory unit during an ON period of the switch unit;
   a phase adjuster unit configured to adjust a phase of the local signal according to the phase control signal stored in the memory unit during the ON period of the switch unit; and
   a gain setting unit configured to set, for the Cartesian loop, a first loop gain when the switch unit is OFF, and a second loop gain higher than the first loop gain when the switch unit is turned from OFF to ON.

2. The apparatus according to claim 1, wherein the signal amplitude is a magnitude of a vector of the input I/Q signals.

3. The apparatus according to claim 1, wherein the signal amplitude is a magnitude of a vector of the feedback I/Q signals.

4. The apparatus according to claim 1, wherein the normalizer unit performs normalization by dividing the phase difference detection signal by a square of the signal amplitude.

5. The apparatus according to claim 1, further comprising a limiter unit configured to be used to cancel an offset voltage included in the normalized phase difference signal.

6. The apparatus according to claim 1, wherein the normalizer unit performs normalization using a current value of the phase difference detection signal during a period in which the signal amplitude is larger than a reference value, and performs normalization using a value of the phase difference detection signal before the signal amplitude becomes smaller than the reference value when the signal amplitude becomes smaller than the reference value.

7. The apparatus according to claim 6, wherein the normalizer unit includes a divider unit configured to generate a division signal by dividing the phase difference detection signal by the signal amplitude, a comparator unit configured to compare the signal amplitude with the reference value to obtain a comparison result signal, and a sample-hold circuit unit configured to be controlled by the comparison result signal, (a) output a division signal corresponding to the current value of the phase difference detection signal as the normalized phase difference signal during the period in which the signal amplitude is larger than the reference value, and (b) sample and hold the division signal and output the normalized phase difference signal when the signal amplitude becomes smaller than the reference value.

8. The apparatus according to claim 6, wherein the normalizer unit includes a comparator unit configured to compare the signal amplitude with the reference value to obtain a comparison result signal, and a sample-hold circuit unit configured to be controlled by the comparison result signal, (a) output a current value of the phase difference detection signal as the normalized phase difference signal during the period in which the signal amplitude is larger than the reference value, and (b) sample and hold the phase difference detection signal and output the normalized phase difference signal when the signal amplitude becomes smaller than the reference value.

9. The apparatus according to claim 6, wherein the normalizer unit includes a first comparator unit configured to compare the signal amplitude with a first reference value to obtain a first comparison result signal, a second comparator unit configured to compare the signal amplitude with a second reference value larger than the first reference value to obtain a second comparison result signal, and a sample-hold circuit unit configured to be controlled by the first comparison result signal and the second comparison result signal, (a) output a current value of the phase difference detection signal as the normalized phase difference signal during a period in which the signal amplitude is larger than the first reference value and is smaller than the second reference value, and (b) sample and hold the phase difference detection signal and output the normalized phase difference signal when the signal amplitude becomes smaller than the first reference value or becomes larger than the second reference value.

10. The apparatus according to claim 1, wherein the normalizer unit includes a low-pass filter unit configured so that a cutoff frequency changes according to the signal amplitude, and generates the normalized phase difference signal by filtering the phase difference detection signal by the low-pass filter unit.

11. The apparatus according to claim 10, wherein the low-pass filter unit is configured so that the cutoff frequency rises with increasing signal amplitude.

12. The apparatus according to claim 10, wherein the low-pass filter unit includes a variable resistor unit configured to be controlled so that a resistance monotonically decreases with increasing signal amplitude, and a capacitor unit configured to be connected to the variable resistor.

13. The apparatus according to claim 10, wherein the low-pass filter unit is configured so that the cutoff frequency rises as the signal amplitude approaches a reference value.

14. The apparatus according to claim 10, wherein the low-pass filter unit includes a first variable resistor unit configured to be controlled so that a resistance monotonically decreases with increasing signal amplitude, a second variable resistor unit configured to be connected in series with the first variable resistor unit and be controlled so that a resistance monotonically increases with decreasing signal amplitude, and a capacitor unit configured to be connected to a series circuit of the first variable resistor unit and the second variable resistor unit.

15. The apparatus according to claim 1, further comprising:
a variable-gain baseband amplifier unit configured to be arranged before the quadrature modulator and amplify the synthesized I/Q signal; and
a gain setting unit configured to set, for the baseband amplifier, a first gain when the switch is OFF, and a second gain higher than the first gain when the switch is turned from OFF to ON.

16. A wireless transmission apparatus using a Cartesian loop, comprising:
adder units configured to generate synthesized I/Q signals by synthesizing input I/Q signals to be transmitted, and feedback I/Q signals;
a quadrature modulator unit configured to generate a quadrature modulated signal;
a power amplifier unit configured to amplify the quadrature modulated signal and output a transmission RF signal;
a quadrature demodulator unit configured to generate the feedback I/Q signals by applying quadrature demodulation using a local signal to a feedback RF signal branched from the transmission RF signal;
a switch unit configured to be used to set ON/OFF of an input of the feedback I/Q signals to the adder units;
an amplitude difference detector unit configured to generate an amplitude difference detection signal by detecting an amplitude difference between the input I/Q signals and the feedback I/Q signals during an OFF period of the switch unit;
a phase difference detector unit configured to generate a phase difference detection signal by detecting a phase difference between the input I/Q signals and the feedback I/Q signals during the OFF period of the switch unit;
a power setting unit configured to set a power of the transmission RF signal;
a control signal generator unit configured to receive the amplitude difference detection signal and the phase difference signal, and generate an amplitude control signal that minimizes the amplitude difference and a phase control signal that minimizes the phase difference in a state in which the power is set during the OFF period of the switch unit;
a memory unit configured to store the amplitude control signal and the phase control signal;
an amplitude adjuster unit configured to adjust an amplitude of the feedback RF signal according to the amplitude control signal stored in the memory unit during an ON period of the switch unit;
a phase adjuster unit configured to adjust a phase of the local signal according to the phase control signal stored in the memory unit during the ON period of the switch unit; and
a gain setting unit configured to set, for the Cartesian loop, a first loop gain when the switch unit is OFF, and a second loop gain higher than the first loop gain when the switch unit is turned from OFF to ON.

* * * * *